(12) United States Patent
Suzuki

(10) Patent No.: US 11,970,389 B2
(45) Date of Patent: Apr. 30, 2024

(54) ACTUATOR DEVICE AND METHOD FOR MANUFACTURING ACTUATOR DEVICE

(71) Applicant: HAMAMATSU PHOTONICS K.K., Hamamatsu (JP)

(72) Inventor: Daiki Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 519 days.

(21) Appl. No.: 17/267,144

(22) PCT Filed: Aug. 9, 2019

(86) PCT No.: PCT/JP2019/031730
§ 371 (c)(1),
(2) Date: Feb. 9, 2021

(87) PCT Pub. No.: WO2020/032274
PCT Pub. Date: Feb. 13, 2020

(65) Prior Publication Data
US 2021/0309509 A1    Oct. 7, 2021

(30) Foreign Application Priority Data

Aug. 10, 2018  (JP) ................. 2018-151230

(51) Int. Cl.
*B81B 3/00*      (2006.01)
*G02B 26/08*     (2006.01)

(52) U.S. Cl.
CPC ........ *B81B 3/0045* (2013.01); *G02B 26/0833* (2013.01); *B81B 2201/042* (2013.01); *B81B 2207/07* (2013.01)

(58) Field of Classification Search
None
See application file for complete search history.

(56) References Cited

U.S. PATENT DOCUMENTS

2005/0128552 A1    6/2005  Yasuda et al.
2007/0008401 A1    1/2007  Cannon et al.
(Continued)

FOREIGN PATENT DOCUMENTS

| CN | 101750735 A | 6/2010 |
| CN | 102474204 A | 5/2012 |

(Continued)

OTHER PUBLICATIONS

International Preliminary Report on Patentability dated Feb. 25, 2021 for PCT/JP2019/031730.

*Primary Examiner* — Jennifer D. Carruth
(74) *Attorney, Agent, or Firm* — Faegre Drinker Biddle & Reath LLP

(57) ABSTRACT

An actuator device includes a support portion; a first movable portion; a second movable portion; a first connection portion that connects the first and second movable portions such that the first movable portion is swingable around a first axis; a second connection portion that connects the second movable portion and the support portion such that the first movable portion is swingable around the first axis. Two natural angular frequencies $\omega_1$ and $\omega_2$ (where $\omega_1 < \omega_2$) for vibration of the first and second movable portions around the first axis satisfy one of the following equation (1) and equation (2) and do not satisfy the other,

[Equation 1]

$$0 < 1 - \left(\frac{\omega_1}{\omega_{ii}}\right)^2 \le 0.2 \quad (1)$$

[Equation 2]

$$0 < \left(\frac{\omega_2}{\omega_{ii}}\right)^2 - 1 \le 0.2 \quad (2)$$

(Continued)

In the above equations, $\omega_{ii}=(k_i/j_i)^{1/2}$, $k_i$ is a torsional spring constant of the first connection portion around the first axis, and $j_i$ is an inertia moment of the first movable portion around the first axis.

35 Claims, 12 Drawing Sheets

(56) References Cited

U.S. PATENT DOCUMENTS

| | | | |
|---|---|---|---|
| 2007/0089973 | A1 | 4/2007 | Inui et al. |
| 2008/0106776 | A1* | 5/2008 | Suzuki ............... H04N 1/00042 |
| | | | 359/224.1 |
| 2011/0116145 | A1* | 5/2011 | Fujii ................. G02B 26/0833 |
| | | | 359/197.1 |

FOREIGN PATENT DOCUMENTS

| | | |
|---|---|---|
| CN | 102798386 A | 11/2012 |
| CN | 104979316 A | 10/2015 |
| CN | 205331316 U | 6/2016 |
| CN | 105849618 A | 8/2016 |
| CN | 108351509 A | 7/2018 |
| EP | 0836265 A1 | 4/1998 |
| EP | 3163352 A1 | 5/2017 |
| JP | 2005-099760 A | 4/2005 |
| JP | 2005-181394 A | 7/2005 |
| JP | 2005-208578 A | 8/2005 |
| JP | 2008-040460 A | 2/2008 |
| JP | 2008-076570 A | 4/2008 |
| JP | 2008-310295 A | 12/2008 |
| JP | 2009-222900 A | 10/2009 |
| JP | 2010-288435 A | 12/2010 |
| JP | 2012-115981 A | 6/2012 |
| JP | 2013-092744 A | 5/2013 |
| JP | 2015-060105 A | 3/2015 |
| JP | 2016-012042 A | 1/2016 |
| JP | 2017-090638 A | 5/2017 |
| WO | WO 2005/063613 A1 | 7/2005 |
| WO | WO-2017/126290 A1 | 7/2017 |

* cited by examiner (a)

(b)

(a)

(b)

(a)

(b)

(a)

(b)

(a)

(b)

(b)

ACTUATOR DEVICE AND METHOD FOR MANUFACTURING ACTUATOR DEVICE

TECHNICAL FIELD

One aspect of the present disclosure relates to an actuator device and a method for producing an actuator device.

BACKGROUND ART

As a microelectromechanical systems (MEMS) device, there is known an actuator device including a support portion, a first movable portion, a second movable portion that surrounds the first movable portion, a pair of first connection portions that connect the first movable portion and the second movable portion to each other on a first axis, and a pair of second connection portions that connect the second movable portion and the support portion to each other on the first axis (for example, refer to Patent Literature 1). In the actuator device described in Patent Literature 1, the first movable portion is provided with a light reflection portion, and when an AC voltage is applied to the light reflection portion, the second movable portion rotates around the first axis and accordingly, the first movable portion rotates around the first axis.

CITATION LIST

Patent Literature

Patent Literature 1: Japanese Unexamined Patent Publication No. 2005-99760

SUMMARY OF INVENTION

Technical Problem

In the actuator device as described above, from the viewpoint of high efficiency, it is preferable that a ratio of the deflection angle of the first movable portion to the deflection angle of the second movable portion is large. In addition, the actuator device as described above requires a stable operation.

One aspect of the present disclosure is to provide an actuator device capable of realizing a highly efficient and stable operation, and a method for producing such an actuator device.

Solution to Problem

According to one aspect of the present disclosure, there is provided an actuator device including: a support portion; a first movable portion; a second movable portion that has a frame shape and surrounds the first movable portion; a first connection portion that connects the first movable portion and the second movable portion to each other such that the first movable portion is swingable around a first axis; a second connection portion that connects the second movable portion and the support portion to each other such that the first movable portion is swingable around the first axis by vibrating the second movable portion; and a drive unit that applies a drive force to the second movable portion. Two natural angular frequencies $\omega_1$ and $\omega_2$ (where $\omega_1 < \omega_2$) for vibration of the first movable portion and the second movable portion around the first axis satisfy one of the following first equation (1) and second equation (2) and do not satisfy the other.

[Equation 1]
$$0 < 1 - \left(\frac{\omega_1}{\omega_{ii}}\right)^2 \leq 0.2 \qquad (1)$$

[Equation 2]
$$0 < \left(\frac{\omega_2}{\omega_{ii}}\right)^2 - 1 \leq 0.2 \qquad (2)$$

In the above equations, $\omega_{ii} = (k_i/j_i)^{1/2}$, $k_i$ is a torsional spring constant of the first connection portion around the first axis, and $j_i$ is an inertia moment of the first movable portion around the first axis.

According to one aspect of the present disclosure, there is provided an actuator device including: a support portion; a first movable portion; a second movable portion that has a frame shape and surrounds the first movable portion; a first connection portion that connects the first movable portion and the second movable portion to each other such that the first movable portion is swingable around a first axis; a second connection portion that connects the second movable portion and the support portion to each other; and a drive unit that is provided in at least one of the first movable portion and the first connection portion to apply a drive force to the first movable portion. Two natural angular frequencies $\omega_1$ and $\omega_2$ (where $\omega_1 < \omega_2$) for vibration of the first movable portion and the second movable portion around the first axis satisfy one of the following first equation (3) and second equation (4) and do not satisfy the other.

[Equation 3]
$$0 < \frac{4\omega_{io}^2}{\omega_{oo}^2 - \omega_1^2} \leq 1 \qquad (3)$$

[Equation 4]
$$\frac{\omega_{oo}^2 - \omega_2^2}{\omega_{io}^2} \leq -6 \qquad (4)$$

In the above equations, $\omega_{io} = (k_i/j_o)^{1/2}$, $\omega_{oo} = (k_o/j_o)^{1/2}$, $k_i$ is a torsional spring constant of the first connection portion around the first axis, $k_o$ is a torsional spring constant of the second connection portion around the first axis, and $j_o$ is an inertia moment of the second movable portion around the first axis.

In these actuator devices, when the two natural angular frequencies $\omega_1$ and $\omega_2$ satisfy the first equation and do not satisfy the second equation, the first movable portion and the second movable portion swing at the natural angular frequency $\omega_1$, so that the ratio of the deflection angle of the first movable portion to the deflection angle of the second movable portion (hereinafter, referred to as an "amplitude ratio") can be 5 or more. Meanwhile, when the two natural angular frequencies $\omega_1$ and $\omega_2$ satisfy the second equation and do not satisfy the first equation, the first movable portion and the second movable portion swing at the natural angular frequency $\omega_2$, so that the amplitude ratio can be 5 or more. Therefore, in both cases, the amplitude ratio can be greatly secured, and the efficiency of the operation can be improved. Furthermore, since only one of the first equation and the second equation is satisfied and the other is not satisfied, the difference between the natural angular frequencies $\omega_1$ and $\omega_2$ can be greatly secured, and an unnecessary resonance response can be suppressed to stabilize the operation. As a result, according to these actuator devices, a highly efficient and stable operation can be implemented.

The second connection portion may connect the second movable portion and the support portion to each other such that the second movable portion is swingable around a second axis intersecting the first axis. In this case, the second movable portion is swingable around the second axis, together with the first movable portion.

The two natural angular frequencies may satisfy the first equation and may not satisfy the second equation. A torsional spring constant of the second connection portion around the first axis may be larger than the torsional spring constant of the first connection portion around the first axis. In this case, the amplitude ratio can be more greatly secured.

A total length of the second connection portion may be shorter than a total length of the first connection portion. In this case, the torsional spring constant of the second connection portion can be suitably made larger than the torsional spring constant of the first connection portion. Furthermore, instead of increasing the cross-sectional areas of the second connection portion, the length of the second connection portion is shortened to increase the torsional spring constant of the second connection portion; and thereby, while the size of the actuator device is reduced, the amplitude ratio can be greatly secured.

The second connection portion may include a plurality of members, each of which connects the second movable portion and the support portion to each other. The plurality of members may be disposed side by side along a direction intersecting the first axis. In this case, the torsional spring constant of the second connection portion can be more suitably made larger than the torsional spring constant of the first connection portion.

The plurality of members may include a first member disposed on the first axis, and a pair of second members disposed to interpose the first member between the second members. In this case, the torsional spring constant of the second connection portion can be more suitably made larger than the torsional spring constant of the first connection portion.

The actuator device according to one aspect of the present disclosure may further include a wiring extending from the second movable portion to the support portion via the second connection portion. The wiring may be disposed to pass through the first member. In this case, since the wiring is disposed to pass through the first member which is subjected to a smaller stress than the second member during vibration of the second movable portion, deterioration of the wiring in the second connection portion can be suppressed.

The two natural angular frequencies may satisfy the second equation and may not satisfy the first equation. A torsional spring constant of the second connection portion around the first axis may be smaller than the torsional spring constant of the first connection portion around the first axis. In this case, the amplitude ratio can be more greatly secured.

A total length of the second connection portion may be longer than a total length of the first connection portion. In this case, the torsional spring constant of the second connection portion can be suitably made smaller than the torsional spring constant of the first connection portion.

The second connection portion may extend in a meandering manner. In this case, the torsional spring constant of the second connection portion can be more suitably made smaller than the torsional spring constant of the first connection portion. Furthermore, since the second connection portion extends in a meandering manner, impact resistance can be further improved, for example, as compared to when the second connection portion extends linearly.

The support portion, the first movable portion, the second movable portion, the first connection portion, and the second connection portion may be configured by a semiconductor substrate. Even in the actuator device configured in such a manner, a highly efficient and stable operation can be implemented.

The actuator device according to one aspect of the present disclosure may further include a sensing coil provided in the first movable portion; and a wiring that is connected to the sensing coil and extends to the second movable portion via the first connection portion. The first connection portion may be made of a semiconductor material. A portion of the wiring, the portion being located on the first connection portion, may be configured by a diffusion region where impurities are diffused in the semiconductor material. In this case, a relatively large stress is applied to the portion of the wiring during swinging of the first movable portion, the portion being located on the first connection portion; however, since the portion is configured by the diffusion region, deterioration of the wiring in the first connection portion can be suppressed.

The diffusion region may extend from the first connection portion to the first movable portion and the second movable portion. A width of the diffusion region in the first movable portion and the second movable portion may be wider than a width of the diffusion region in the first connection portion. In this case, the resistance of the wiring can be reduced.

A portion of the wiring, the portion being located on the first movable portion, and a portion of the wiring, the portion being located on the second movable portion, may be made of a metallic material. A width of a contact portion between the diffusion region and each of the portion located on the first movable portion and the portion located on the second movable portion may be wider than a width of the first connection portion. In this case, the resistance of the wiring can be further reduced. In addition, even when a misalignment occurs during production or the like, the diffusion region can be reliably electrically connected to each of the portion located on the first movable portion and the portion located on the second movable portion.

According to one aspect of the present disclosure, there is provided a method for producing an actuator device including a support portion, a first movable portion, a second movable portion that has a frame shape and surrounds the first movable portion, a first connection portion that connects the first movable portion and the second movable portion to each other such that the first movable portion is swingable around a first axis, a second connection portion that connects the second movable portion and the support portion to each other such that the first movable portion is swingable around the first axis by vibrating the second movable portion, and a drive unit that applies a drive force to the second movable portion, in which two natural angular frequencies $\omega_1$ and $\omega_2$ (where $\omega_1 < \omega_2$) for vibration of the first movable portion and the second movable portion around the first axis satisfy one of the following equation (5) and equation (6) and do not satisfy the other.

[Equation 5]

$$0 < 1 - \left(\frac{\omega_1}{\omega_{ii}}\right)^2 \leq 0.2 \quad (5)$$

-continued

[Equation 6]

$$0 < \left(\frac{\omega_2}{\omega_{ii}}\right)^2 - 1 \le 0.2 \quad (6)$$

In the above equations, $\omega_{ii}=(k_i/j_i)^{1/2}$ $k_i$ is a torsional spring constant of the first connection portion around the first axis, and $j_i$ is an inertia moment of the first movable portion around the first axis.

According to one aspect of the present disclosure, there is provided a method for producing an actuator device including a support portion, a first movable portion, a second movable portion that has a frame shape and surrounds the first movable portion, a first connection portion that connects the first movable portion and the second movable portion to each other such that the first movable portion is swingable around a first axis, a second connection portion that connects the second movable portion and the support portion to each other, and a drive unit that is provided in at least one of the first movable portion and the first connection portion to apply a drive force to the first movable portion, in which two natural angular frequencies $\omega_1$ and $\omega_2$ (where $\omega_1 < \omega_2$) for vibration of the first movable portion and the second movable portion around the first axis satisfy one of the following equation (7) and equation (8) and do not satisfy the other.

[Equation 7]

$$0 < \frac{4\omega_{io}^2}{\omega_{oo}^2 - \omega_1^2} \le 1 \quad (7)$$

[Equation 8]

$$\frac{\omega_{oo}^2 - \omega_2^2}{\omega_{io}^2} \le -6 \quad (8)$$

In the above equations, $\omega_{io}=(k_i/j_o)^{1/2}$, $\omega_{oo}=(k_o/j_o)^{1/2}$, $k_i$ is a torsional spring constant of the first connection portion around the first axis, $k_o$ is a torsional spring constant of the second connection portion around the first axis, and $j_o$ is an inertia moment of the second movable portion around the first axis.

According to the actuator device produced by the production methods, a highly efficient and stable operation can be implemented for the reasons described above.

Advantageous Effects of Invention

According to one aspect of the present disclosure, it is possible to provide the actuator device capable of realizing a highly efficient and stable operation, and the method for producing such an actuator device.

DESCRIPTION OF EMBODIMENTS

Hereinafter, one embodiment of the present disclosure will be described in detail with reference to the drawings. Incidentally, in the following description, the same reference signs are used for the same or equivalent components and duplicated descriptions will be omitted.

First Embodiment

Figure 1:
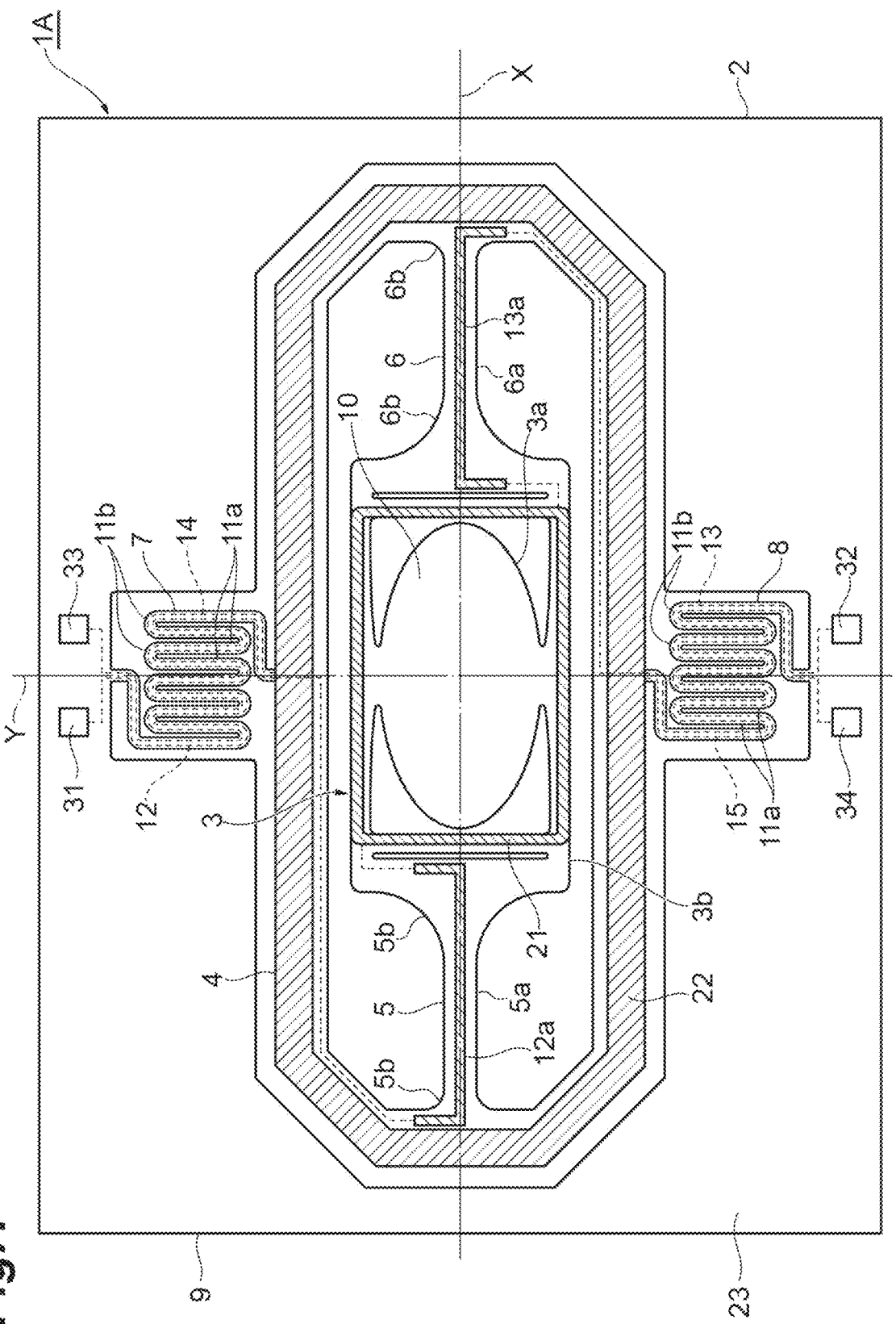
FIG. 1 is a plan view of a mirror device according to a first embodiment.

As illustrated in FIG. 1, a mirror device 1A of a first embodiment includes a support portion 2, a first movable portion 3, a second movable portion 4, a pair of first connection portions 5 and 6, a pair of second connection portions 7 and 8, and a magnetic field generation unit 9. The support portion 2, the first movable portion 3, the second movable portion 4, the first connection portions 5 and 6, and the second connection portions 7 and 8 are integrally configured by, for example, a semiconductor substrate such as a silicon on insulator (SOI) substrate. Namely, the mirror device 1A is configured as a MEMS device.

In the mirror device 1A, the first movable portion 3 having a mirror surface (optical surface) 10 swings around each of an X-axis (first axis) and a Y-axis (second axis perpendicular to the first axis) orthogonal to each other. The mirror device 1A can be used, for example, in an optical switch for optical communication, an optical scanner, and the like. The magnetic field generation unit 9 is configured by, for example, permanent magnets in a Halbach array and the like.

The support portion 2 has, for example, a quadrilateral external shape in plan view, and is formed in a frame shape. The support portion 2 is disposed on one side in a direction perpendicular to the X-axis and the Y-axis with respect to the magnetic field generation unit 9. The first movable portion 3 is disposed inside the support portion 2 in a state where the first movable portion 3 is separated from the magnetic field generation unit 9. Incidentally, the "plan view" means when seen in the direction perpendicular to the X-axis and the Y-axis, in other words, means when seen in a direction perpendicular to a plane on which the support portion 2, the first movable portion 3, the second movable portion 4, and the like are disposed.

The first movable portion 3 includes a main body portion 3a and a frame 3b surrounding the main body portion 3a. The main body portion 3a is formed, for example, in an elliptical shape in plan view. For example, the mirror surface 10 having a circular shape is provided on a surface on an opposite side of the main body portion 3a from the magnetic field generation unit 9. The mirror surface 10 is configured by, for example, a reflection film made of aluminum, an aluminum alloy, silver, a silver alloy, gold, a dielectric multilayer film, or the like. The frame 3b has, for example, a quadrilateral external shape in plan view, and is formed in a frame shape. The main body portion 3a is connected to the frame 3b on both sides on the Y-axis.

The second movable portion 4 has, for example, an octagonal external shape in plan view, and is formed in a frame shape. The second movable portion 4 is disposed inside the support portion 2 to surround the first movable portion 3 in a state where the second movable portion 4 is separated from the magnetic field generation unit 9.

The first connection portions 5 and 6 are disposed on both sides of the first movable portion 3 on the X-axis. Each of the first connection portions 5 and 6 connects the first movable portion 3 and the second movable portion 4 to each other on the X-axis such that the first movable portion 3 is swingable around the X-axis (X-axis serving as a center axis). Each of the first connection portions 5 and 6 is twisted around the X-axis when the first movable portion 3 swings around the X-axis. Each of the first connection portions 5 and 6 extends linearly, for example, along the X-axis. Each of the first connection portions 5 and 6 is formed, for example, in a plate shape that extends along the plane perpendicular to the X-axis and the Y-axis.

The first connection portion 5 includes a linear portion 5a that extends along the X-axis and has a constant width, and a pair of widened portions 5b connected to both ends of the linear portion 5a. In plan view, one widened portion 5b is increased in width as approaching the first movable portion 3, and the other widened portion 5b is increased in width as approaching the second movable portion 4. A pair of edges of each of the widened portions 5b are curved to protrude toward each other.

The first connection portion 6 includes a linear portion 6a that extends along the X-axis and has a constant width, and a pair of widened portions 6b connected to both ends of the linear portion 6a. In plan view, one widened portion 6b is increased in width as approaching the first movable portion 3, and the other widened portion 6b is increased in width as approaching the second movable portion 4. A pair of edges of each of the widened portions 6b are curved to protrude toward each other.

The second connection portions 7 and 8 are disposed on both sides of the second movable portion 4 on the Y-axis. Each of the second connection portions 7 and 8 connects the second movable portion 4 and the support portion 2 to each other on the Y-axis such that the second movable portion 4 is swingable around the Y-axis (Y-axis serving as a center axis). Each of the second connection portions 7 and 8 is twisted around the Y-axis when the second movable portion 4 swings around the Y-axis. Each of the second connection portions 7 and 8 extends in a meandering manner in plan view. Each of the second connection portions 7 and 8 includes a plurality of linear portions 11a and a plurality of folded portions 11b. The plurality of linear portions 11a extend along a Y-axis direction, and are disposed side by side in an X-axis direction. The plurality of folded portions 11b alternately connect both ends of the linear portions 11a adjacent to each other.

The torsional spring constant of each of the second connection portions 7 and 8 around the X-axis is smaller than the torsional spring constant of each of the first connection portions 5 and 6 around the X-axis. The torsional spring constant of each of the first connection portions 5 and 6 around the X-axis is a ratio of the torsional moment around the X-axis, which is applied to each of the first connection portions 5 and 6, to the torsional angle of each of the first connection portions 5 and 6 around the X-axis. The torsional spring constant of each of the second connection portions 7 and 8 around the X-axis is a ratio of the torsional moment around the X-axis, which is applied to each of the second connection portions 7 and 8, to the torsional angle of each of the second connection portions 7 and 8 around the X-axis.

The total length of each of the second connection portions 7 and 8 is longer than the total length of each of the first connection portions 5 and 6. The total length of each of the first connection portions 5 and 6 is the total length along an extending direction (direction along the X-axis in this example) of each of the first connection portions 5 and 6. The total length of the second connection portion 7 is the total length along an extending direction of the second connection portion 7, and in this example, is the total length obtained by adding the lengths of portions including the linear portions 11a and the folded portions 11b. The same point also applies to the total length of the second connection portion 8.

The mirror device 1A further includes coils (drive coils) 21 and 22, a plurality of wirings 12, 13, 14, and 15, and a plurality of electrode pads 31, 32, 33, and 34. The coil 21 is embedded, for example, in the frame 3b of the first movable portion 3, and extends spirally in plan view. The coil 22 is embedded, for example, in the second movable portion 4, and extends spirally in plan view. The coils 21 and 22 are made of a metallic material such as copper. In FIG. 1, the regions of disposition of the coils 21 and 22 are illustrated by hatching.

The plurality of electrode pads 31, 32, 33, and 34 are provided on the support portion 2, and are exposed to the outside from an insulation layer 23. The insulation layer 23 is integrally formed to cover the surfaces (surfaces opposite to the magnetic field generation unit 9) of the support portion 2, the first movable portion 3, the second movable portion 4, the first connection portions 5 and 6, and the second connection portions 7 and 8. The insulation layer 23 is made of, for example, silicon dioxide, silicon nitride, or the like.

The wiring 12 electrically connects one end of the coil 21 and the electrode pad 31. The wiring 12 extends from the one end of the coil 21 to the electrode pad 31 via the first connection portion 5, the second movable portion 4, and the second connection portion 7. The wiring 13 electrically connects the other end of the coil 21 and the electrode pad 32. The wiring 13 extends from the other end of the coil 21 to the electrode pad 32 via the first connection portion 6, the second movable portion 4, and the second connection portion 8. Portions 12a and 13a of the wirings 12 and 13 are made of a metallic material such as tungsten, the portions 12a and 13a passing through the first connection portions 5 and 6. The other portions of the wirings 12 and 13 are made of a metallic material such as aluminum, an aluminum alloy, or copper. In FIG. 1, the portions 12a and 13a are illustrated by hatching.

The wiring 14 electrically connects one end of the coil 22 and the electrode pad 33. The wiring 14 extends from the one end of the coil 22 to the electrode pad 33 via the second connection portion 7. The wiring 15 electrically connects the other end of the coil 22 and the electrode pad 34. The wiring 15 extends from the other end of the coil 22 to the electrode pad 34 via the second connection portion 8.

In the mirror device 1A configured as described above, when a drive signal for linear operation is input to the coil 22 via the electrode pads 33 and 34 and the wirings 14 and 15, a Lorentz force is applied to the coil 22 by interaction with a magnetic field generated by the magnetic field generation unit 9. The balance between the Lorentz force and the elastic forces of the second connection portions 7 and 8 can be used to cause the mirror surface 10 (first movable portion 3) to linearly operate around the Y-axis, together with the second movable portion 4.

Meanwhile, when a drive signal for resonance operation is input to the coil 21 via the electrode pads 31 and 32 and the wirings 12 and 13, a Lorentz force is applied to the coil 21 by interaction with a magnetic field generated by the magnetic field generation unit 9. In addition to the Lorentz force, the resonance of the first movable portion 3 at the resonance frequency can be used to cause the mirror surface 10 (first movable portion 3) to resonate around the X-axis. Namely, in the mirror device 1A, the coil 21 and the magnetic field generation unit 9 form a drive unit that directly applies a drive force (Lorentz force) to the first movable portion 3, and the coil 22 and the magnetic field generation unit 9 form a drive unit that directly drives a drive force (Lorentz force) to the second movable portion 4.

Second Embodiment

Figure 2:
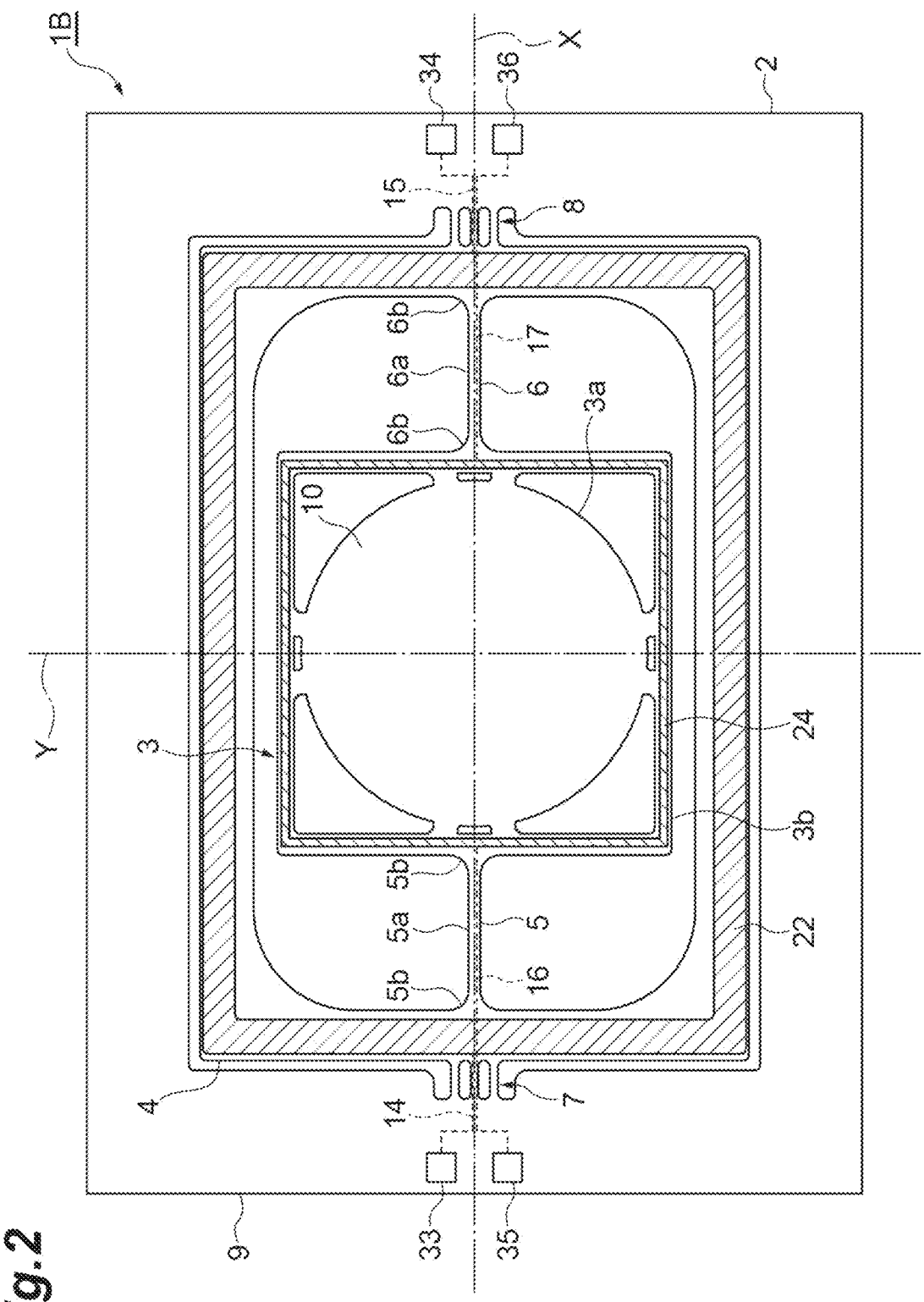
FIG. 2 is a plan view of a mirror device according to a second embodiment.

In the mirror device 1A of the first embodiment, the first movable portion 3 swings around each of the X-axis and the Y-axis whereas in a mirror device 1B of a second embodiment illustrated in FIG. 2, the first movable portion 3 swings only around the X-axis. In the mirror device 1B, the main body portion 3a of the first movable portion 3 is formed in a circular shape in plan view. The main body portion 3a is connected to the frame 3b on both sides on the X-axis and on both sides on the Y-axis. The second movable portion 4 has a quadrilateral external shape in plan view.

The second connection portions 7 and 8 are disposed on both sides of the second movable portion 4 on the X-axis. The second connection portions 7 and 8 connect the second movable portion 4 and the support portion 2 to each other on the X-axis such that the second movable portion 4 is vibrated to cause the first movable portion 3 to be swingable around the X-axis. Each of the second connection portions 7 and 8 is twisted around the X-axis when the second movable portion 4 vibrates.

The mirror device 1B does not include the coil 21, the wirings 12 and 13, and the electrode pads 31 and 32, and includes the coil 22, a coil (electromotive force monitoring coil or sensing coil) 24, a plurality of wirings 14, 15, 16, and 17, and a plurality of electrode pads 33, 34, 35, and 36. The coil 24 is embedded, for example, in the frame 3b of the first movable portion 3, and extends spirally in plan view. The coil 24 is made of a metallic material such as copper.

The wiring 16 electrically connects one end of the coil 24 and the electrode pad 35. The wiring 17 extends from the one end of the coil 24 to the electrode pad 35 via the first connection portion 5, the second movable portion 4, and the second connection portion 7. The wiring 17 electrically connects the other end of the coil 24 and the electrode pad 36. The wiring 17 extends from the other end of the coil 24 to the electrode pad 36 via the first connection portion 6, the second movable portion 4, and the second connection portion 8.

In the mirror device 1B, when a drive signal for resonance operation is input to the coil 22 via the electrode pads 33 and 34 and the wirings 14 and 15, a Lorentz force is applied to the coil 22 by interaction with a magnetic field generated by the magnetic field generation unit 9. In addition to the Lorentz force, the resonance of the first movable portion 3 at the resonance frequency can be used to cause the mirror surface 10 (first movable portion 3) to resonate around the X-axis. Specifically, when a drive signal of a frequency equal to the resonance frequency of the first movable portion 3 around the X-axis is input to the coil 22, the second movable portion 4 vibrates slightly around the X-axis at the frequency. The vibration is transmitted to the first movable portion 3 via the first connection portions 5 and 6, so that the first movable portion 3 can swing around the X-axis at the frequency.

In addition, in the mirror device 1B, during operation of the first movable portion 3, an electromotive force is generated in the coil 24 by interaction with a magnetic field generated by the magnetic field generation unit 9. For this reason, a signal output from the electrode pads 35 and 36 via the wirings 16 and 17 is monitored, so that the deflection angle of the first movable portion 3, namely, the deflection angle of the mirror surface 10 can be identified. In such a manner, the coil 24 serves as an electromotive force monitoring coil.

Figure 3:
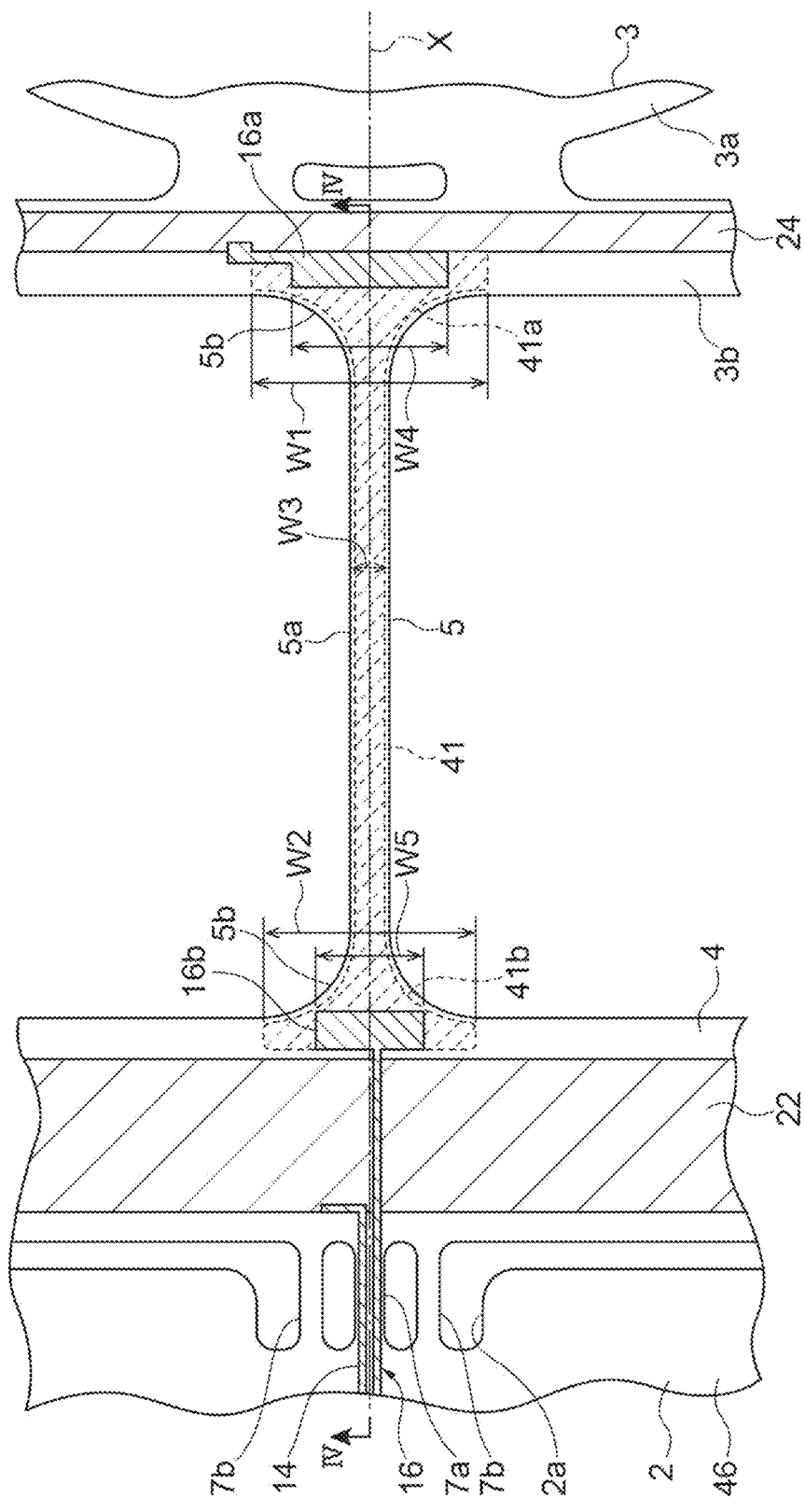
FIG. 3 is a partial enlarged view of FIG. 2.

Subsequently, the configuration of each part of the mirror device 1B will be further described with reference to FIGS. 2 and 3. Hereinafter, a structure around the first connection portion 5 and the second connection portion 7 will be described, and the first connection portion 6 and the second connection portion 8 are also similarly configured.

The second connection portion 7 includes a first member 7a and a pair of second members 7b. The first member 7a and the pair of second members 7b extend along the X-axis to connect the second movable portion 4 and the support portion 2 to each other. For example, the first member 7a and the pair of second members 7b are disposed side by side along a direction parallel to the Y-axis. The first member 7a is disposed on the X-axis, and the pair of second members 7b are disposed to interpose the first member 7a therebetween. For example, the first member 7a and the pair of second members 7b are disposed side by side at equal intervals to be close to each other. The first member 7a and the pair of second members 7b are formed, for example, in the same shape. Each of the second members 7b serves as a vibration suppressing portion that suppresses the vibration of the second movable portion 4 around the X-axis.

The support portion 2 is provided with a recessed portion 2a located on the X-axis, and the first member 7a and the pair of second members 7b are connected to the support portion 2 in the recessed portion 2a. As a result, while the lengths of the first member 7a and the pair of second members 7b are secured, the size of the mirror device 1B can be reduced.

The torsional spring constant of the second connection portion 7 around the X-axis is smaller than the torsional spring constant of the first connection portion 5 around the X-axis. The torsional spring constant of the second connection portion 7 around the X-axis is the torsional spring constant of the entirety of the second connection portion 7, which includes the first member 7a and the pair of second members 7b, around the X-axis. The total length of the second connection portion 7 is shorter than the total length of the first connection portion 5. For example, the total length of the second connection portion 7 is shorter than ½ of the total length of the first connection portion 5. In this example, the total length of the second connection portion 7 is the total length obtained by adding the lengths of the first member 7a and the pair of second members 7b. In this example, the first member 7a and the pair of second members 7b are equal to each other in length.

A portion of the wiring 16, the portion being located on the first connection portion 5, is configured by a diffusion region 41 where impurities are diffused in a semiconductor material. The diffusion region 41 is formed by diffusing n-type impurities on the surface of a p-type silicon substrate. The wiring 16 further includes an inner portion 16a that electrically connects one end portion 41a of the diffusion region 41 and the coil 24, and an outer portion 16b that electrically connects the other end portion 41b of the diffusion region 41 and the coil 24.

The diffusion region 41 extends from the first connection portion 5 to the first movable portion 3, and is connected to the inner portion 16a on the first movable portion 3. In addition, the diffusion region 41 extends from the first connection portion 5 to the second movable portion 4, and is connected to the outer portion 16b on the second movable portion 4. The outer portion 16b extends to pass through the first member 7a of the second connection portion 7 to be connected to the electrode pad 35. Similarly, the wiring 14 extending from the coil 22 also extends to pass through the first member 7a of the second connection portion 7 to be connected to the electrode pad 33.

The end portion 41a is increased in width as approaching the coil 24, and the end portion 41b is increased in width as approaching the coil 22. The end portions 41a and 41b have external shapes along a pair of widened portions 5b of the first connection portion 5. A width W1 of the end portion 41a and a width W2 of the end portion 41b are wider than a width W3 of the first connection portion 5. Namely, each of the widths W1 and W2 is wider than the width of the diffusion region 41 on the first connection portion 5. The width of each part of the diffusion region 41 is the maximum width in plan view, and is a width in a direction perpendicular to an extending direction of the diffusion region 41 (direction parallel to the Y-axis in this example). The width of the first connection portion 5 is the minimum width in plan view, and for example, is the width of the linear portion 5a in a direction perpendicular to an extending direction of the first connection portion 5 (direction parallel to the Y-axis in this example). Incidentally, the first connection portion 5 is a portion that is twisted around the X-axis when the first movable portion 3 swings around the X-axis, and in the mirror device 1B, the first connection portion 5 includes the pair of widened portions 5b.

Figure 4:
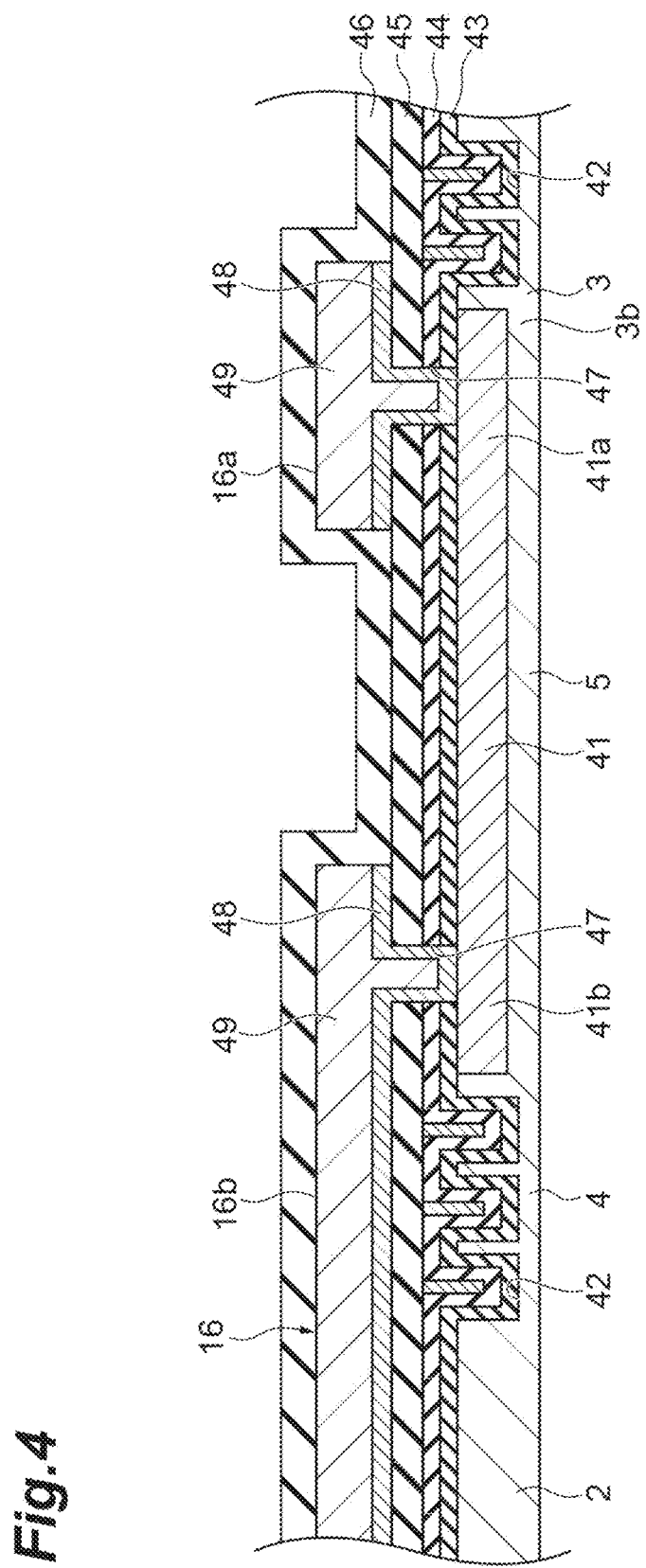
FIG. 4 is a cross-sectional view along line IV-IV of FIG. 3.

As illustrated in FIG. 4, the first movable portion 3 is provided with a groove 42a having a shape corresponding to the coil 24, and the second movable portion 4 is provided with a groove 42b having a shape corresponding to the coil 22. Insulation layers 43 and 44 are provided on inner surfaces of the grooves 42a and 42b, and insulation layers 45 and 46 are provided on the insulation layer 44. The coil 24 is disposed in the groove 42 with the insulation layers 43 and 44 interposed therebetween.

Each of the insulation layers 43 to 46 is made of, for example, silicon dioxide, silicon nitride, or the like. The inner portion 16a and the outer portion 16b of the wiring 16 are disposed on the insulation layer 45. The inner portion 16a and the outer portion 16b are formed to enter an opening 47 penetrating through the insulation layers 43 to 45, and are connected to the diffusion region 41 in the opening 47.

Each of the inner portion 16a and the outer portion 16b includes a first layer 48 and a second layer 49 disposed on the first layer 48. The first layer 48 serves as a contact layer in contact with the diffusion region 41, and also serves as a barrier layer that prevents the diffusion of a metal element into the silicon substrate, the metal element being contained in the second layer 49. The first layer 48 is made of a metallic material such as tungsten, titanium nitride, molybdenum, tantalum, or tantalum nitride. The second layer 49 is made of, for example, an aluminum alloy or copper.

A width W4 of a contact portion between the diffusion region 41 and the inner portion 16a and a width W5 of a contact portion between the diffusion region 41 and the outer portion 16b are wider than the width W3 of the first connection portion 5. The widths of the contact portions are widths in the direction perpendicular to the extending direction of the first connection portion 5 (direction parallel to the Y-axis in this example) in plan view.

[Method for Producing Mirror Device]

Figure 5:
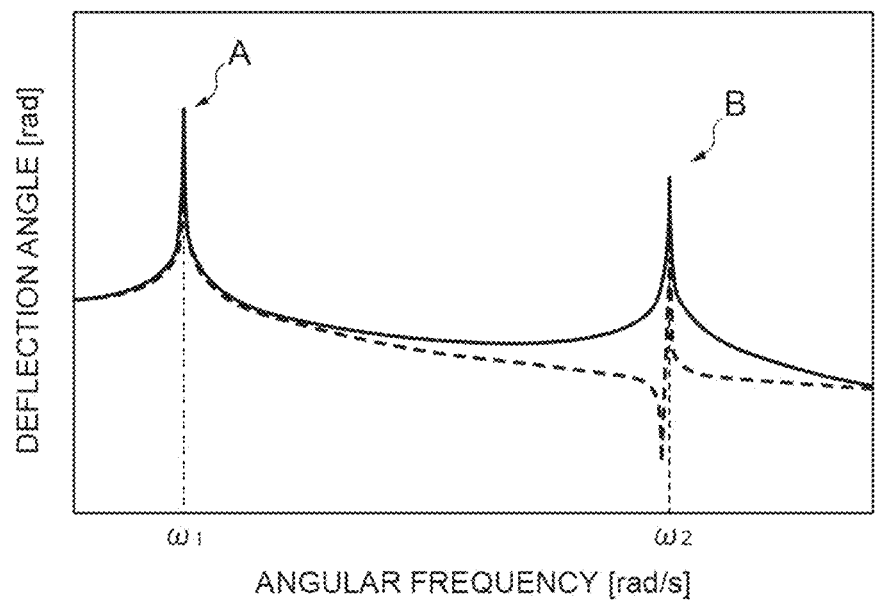
FIGS. 5(a) and 5(b) are graphs showing examples of a relationship between the input angular frequency and the deflection angle.
Figure 5:
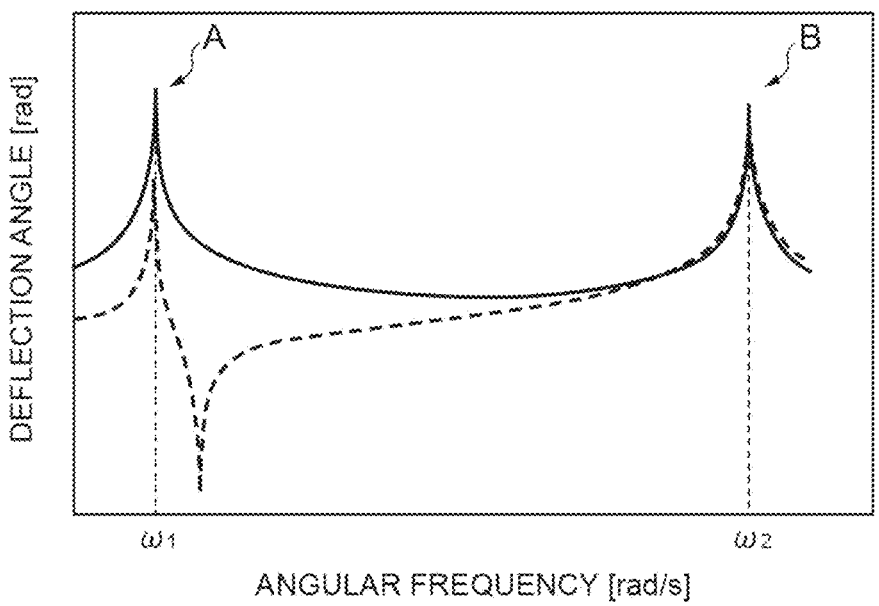

Subsequently, a method (design method) for producing the mirror devices 1A and 1B as described above will be described. FIG. 5(a) is a graph showing an example of a relationship between the angular frequency of the drive signal and the deflection angles of the first movable portion 3 and the second movable portion 4 around the X-axis, and FIG. 5(b) is a graph showing another example of the relationship. In FIGS. 5(a) and 5(b), the deflection angle of the first movable portion 3 is illustrated by a solid line, and the deflection angle of the second movable portion 4 is illustrated by a broken line.

As shown in FIGS. 5(a) and 5(b), in the mirror devices 1A and 1B, a two degree of freedom system including the support portion 2, the first movable portion 3, the second movable portion 4, the first connection portions 5 and 6, and the second connection portions 7 and 8 has two resonance points A and B for vibration around the X-axis. It should be noted that in the two degree of freedom system, only the vibration around the X-axis is taken into consideration, and vibration around the Y-axis is not taken into consideration. A natural angular frequency $\omega_1$ at the resonance point A and a natural angular frequency ($02 at the resonance point B (where $\omega_1 < \omega_2$) are natural angular frequencies for the vibration of the first movable portion 3 and the second movable portion 4 around the X-axis. The resonance point A can be used to operate the mirror surface 10 at a relatively small frequency. The resonance point B can be used to operate the mirror surface 10 at a relatively large frequency.

Figure 6:
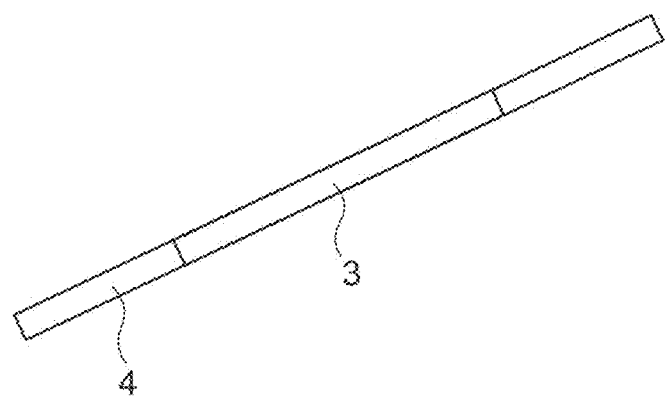
FIG. 6(a) is a schematic view illustrating an example of a relationship between the deflection angles of a first movable portion and a second movable portion at a resonance point A of FIG. 5(a)
FIG. 6(b) is a schematic view illustrating an example of a relationship between the deflection angles of the first movable portion and the second movable portion at a resonance point B of FIG. 5(a).
Figure 6:
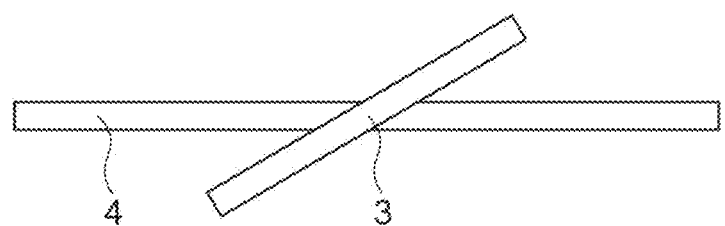

The relationship between the deflection angles of the first movable portion 3 and the second movable portion 4 when the mirror surface 10 is operated at the resonance point A of FIG. 5(a) can be illustrated as in FIG. 6(a), and the relationship between the deflection angles of the first movable portion 3 and the second movable portion 4 when the mirror surface 10 is operated at the resonance point B of FIG. 5(a) can be illustrated as in FIG. 6(b).

As illustrated in FIG. 6(a), when the mirror surface 10 is operated at the resonance point A of FIG. 5(a), the first movable portion 3 and the second movable portion 4 rotate to the same extent, so that the difference between the deflection angles of the first movable portion 3 and the second movable portion 4 is small. Namely, the first connection portions 5 and 6 are hardly twisted. As illustrated in FIG. 6(b), when the mirror surface 10 is operated at the resonance point B of FIG. 5(a), whereas the second movable portion 4 hardly rotates, the first movable portion 3 rotates, so that the difference between the deflection angles of the first movable portion 3 and the second movable portion 4 is large. Namely, the first connection portions 5 and 6 are efficiently twisted.

Contrary to the example of FIG. 5(a), in the example of FIG. 5(b), when the mirror surface 10 is operated at the resonance point A, whereas the second movable portion 4 hardly rotates, the first movable portion 3 rotates, and when the mirror surface 10 is operated at the resonance point B, the first movable portion 3 and the second movable portion 4 rotate to the same extent. From the viewpoint of high efficiency, when the mirror surface 10 is operated at either of the resonance points A and B, it is preferable that whereas the deflection angle of the first movable portion 3 is large, the deflection angle of the second movable portion 4 is small Namely, it is preferable that a ratio of the deflection angle of the first movable portion 3 to the deflection angle of the second movable portion 4 (hereinafter, referred to as an "amplitude ratio") is greatly secured. Hereinafter, a method for producing the mirror devices 1A and 1B, which greatly secures the amplitude ratio, will be described.

[Case of Outer Drive]

Figure 7:
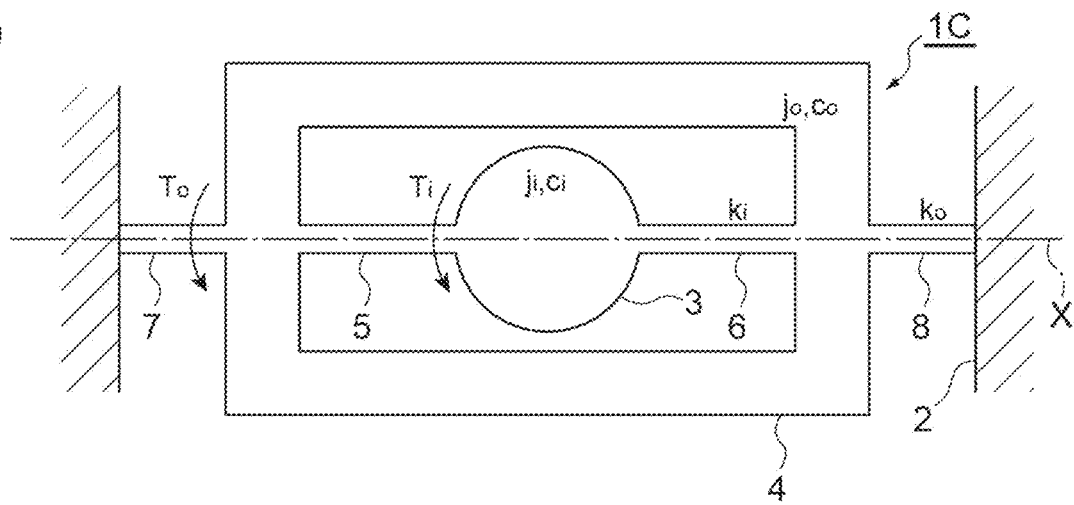
FIG. 7(a) is a schematic plan view of an exemplary mirror device.
FIG. 7(b) is a diagram illustrating a vibration model of the mirror device of FIG. 7(a).
Figure 7:
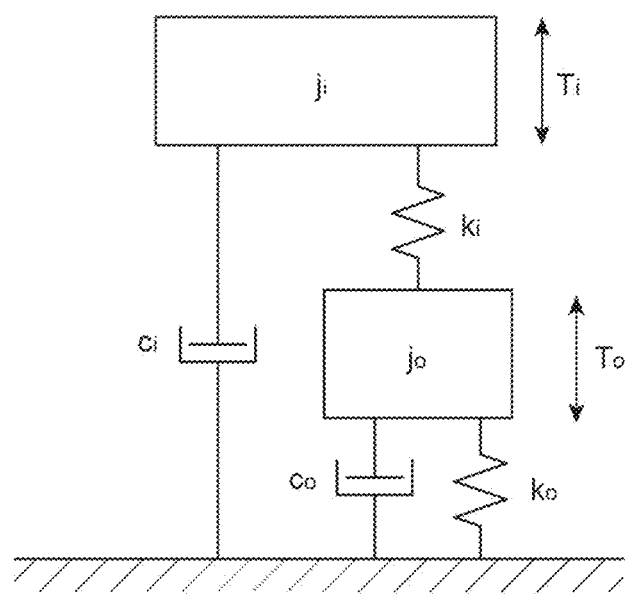

First, as in the mirror device 1B, a case where a drive force is applied to the second movable portion 4 to cause the first movable portion 3 to resonate (case of outer drive) will be described. FIG. 7(a) is a schematic plan view of a mirror device 1C that is an exemplary example, and FIG. 7(b) is a diagram illustrating a vibration model of the mirror device 1C. The vibration of the first movable portion 3 and the second movable portion 4 around the X-axis can be modeled by the vibration model illustrated in FIG. 7(b). The equations of motion for the vibration of the first movable portion 3 and the second movable portion 4 around the X-axis are expressed by the following equations (9) and (10).

[Equation 9]

$$j_i \frac{d^2\theta_i}{dt^2} + c_i \frac{d\theta_i}{dt} + k_i(\theta_i - \theta_o) = T_i \cos(\omega t) = 0 \quad (9)$$

[Equation 10]

$$j_o \frac{d^2\theta_o}{dt^2} + c_o \frac{d\theta_o}{dt} + (k_i - k_o)\theta_o - k_i\theta_i = T_o \cos(\omega t) \quad (10)$$

In the above equations, $\theta_i$ is the deflection angle (rad) of the first movable portion 3 (deflection angle of each of the first connection portions 5 and 6), $j_i$ is the inertia moment (kgm$^2$) of the first movable portion 3, $k_i$ is the torsional spring constant (Nm/rad) of the first connection portions 5 and 6, $c_i$ is the viscous damping coefficient (Ns/m) of the first movable portion 3, $T_i$ is torque (Nm) applied to the first movable portion 3, $\theta_o$ is the deflection angle (rad) of the second movable portion 4 (deflection angle of each of the second connection portions 7 and 8), $j_o$ is the inertia moment (kgm$^2$) of the second movable portion 4, $k_o$ is the torsional spring constant (Nm/rad) of each of the second connection portions 7 and 8, $c_o$ is the viscous damping coefficient (Ns/m) of the second movable portion 4, $T_o$ is torque (Nm) applied to the second movable portion 4, $\omega$ is the angular frequency (rad/s) of the drive signal, and t is time (s). The values are values for vibration around the X-axis. The viscous damping coefficients $c_i$ and $c_o$ are expressed by the following equations (11) and (12). Here, is the damping ratio of the first movable portion 3, and is the damping ratio of the second movable portion 4.

[Equation 11]

$$c_i = 2\zeta_i \sqrt{j_i k_i} \quad (11)$$

[Equation 12]

$$c_o = 2\zeta_o \sqrt{j_o k_o} \quad (12)$$

In the case of outer drive, since a drive force is not applied to the first movable portion 3 (namely, since $T_i$=0), the right side of equation (9) is 0.

The deflection angle $\theta_i$ of the first movable portion 3 and the deflection angle $\theta_o$ of the second movable portion 4 are obtained from equations (9) and (10) as expressed in the following equations (13) and (14).

[Equation 13]

$$\theta_i = \frac{T_o}{j_o \omega_{oo}^2} \sqrt{\frac{B^2 + C^2}{(\beta_{io}^2 B - \beta_{io}^2 - 1 + \beta_{oo}^2)^2 + (\beta_{io}^2 C + 2\beta_{oo}\zeta_o)^2}} \quad (13)$$

[Equation 14]

$$\theta_o = \frac{T_o}{j_o \omega_{oo}^2} \sqrt{\frac{1}{(\beta_{io}^2 B - \beta_{io}^2 - 1 + \beta_{oo}^2)^2 + (\beta_{io}^2 C + 2\beta_{oo}\zeta_o)^2}} \quad (14)$$

where

[Equation 15]

$$B = \frac{1 - \beta_{ii}^2}{(1 - \beta_{ii}^2)^2 + 4\beta_{ii}^2 \zeta_i^2} \quad (15)$$

[Equation 16]

$$C = \frac{4\beta_{ii}^2 \zeta_i^2}{(1 - \beta_{ii}^2)^2 + 4\beta_{ii}^2 \zeta_i^2} \quad (16)$$

[Equation 17]

$$\beta_{ii} = \frac{\omega}{\omega_{ii}} = \frac{\omega}{\sqrt{\frac{k_i}{j_i}}} \quad (17)$$

[Equation 18]

$$\beta_{oo} = \frac{\omega}{\omega_{oo}} = \frac{\omega}{\sqrt{\frac{k_o}{j_o}}} \quad (18)$$

[Equation 19]

$$\beta_{io} = \frac{\omega_{io}}{\omega_{oo}} = \frac{\sqrt{\frac{k_i}{j_o}}}{\sqrt{\frac{k_o}{j_o}}} = \sqrt{\frac{k_i}{k_o}} \quad (19)$$

In this case, the amplitude ratio $\theta_i/\theta_o$ is expressed by the following equation (20). Incidentally, $\zeta_o$ is, for example, 0.01 or less, which is extremely smaller than 1.

[Equation 20]

$$\frac{\theta_i}{\theta_o} = \sqrt{\frac{1}{(1 - \beta_{ii}^2)^2 + 4\beta_{ii}^\eta \zeta_i^2}} = \sqrt{\frac{1}{\left\{1 - \left(\frac{\omega}{\omega_{ii}}\right)^2\right\}^2}} \quad (\because \zeta_i \ll 1) \quad (20)$$

Therefore, the condition for setting the amplitude ratio to 5 or more is expressed by the following equation (21).

[Equation 21]

$$\frac{\theta_i}{\theta_o} = \sqrt{\frac{1}{\left\{1-\left(\frac{\omega}{\omega_{ii}}\right)^2\right\}^2}} \geq 5 \quad (21)$$

When the mirror surface 10 is operated at the natural angular frequency $\omega_1$ of the resonance point A (namely, when $\omega=\omega_1$), since $1-(\omega_1/\omega_{ii})^2$ is larger than 0, the condition for setting the amplitude ratio to 5 or more is expressed by the following equation (22).

[Equation 22]

$$0 < 1-\left(\frac{\omega_1}{\omega_{ii}}\right)^2 \leq 0.2 \quad (22)$$

When the mirror surface 10 is operated at the natural angular frequency $\omega_2$ of the resonance point B (namely, when $\omega=\omega_2$), since $1-(\omega_2/\omega_{ii})^2$ is smaller than 0, the condition for setting the amplitude ratio to 5 or more is expressed by the following equation (23).

[Equation 23]

$$0 < \left(\frac{\omega_2}{\omega_{ii}}\right)^2 - 1 \leq 0.2 \quad (23)$$

Namely, when the mirror surface 10 is operated at the natural angular frequency $\omega_1$, the mirror device is designed and produced to satisfy equation (22), so that the amplitude ratio can be 5 or more, and when the mirror surface 10 is operated at the natural angular frequency $\omega_2$, the mirror device is designed and produced to satisfy equation (23), so that the amplitude ratio can be 5 or more.

Figure 8:
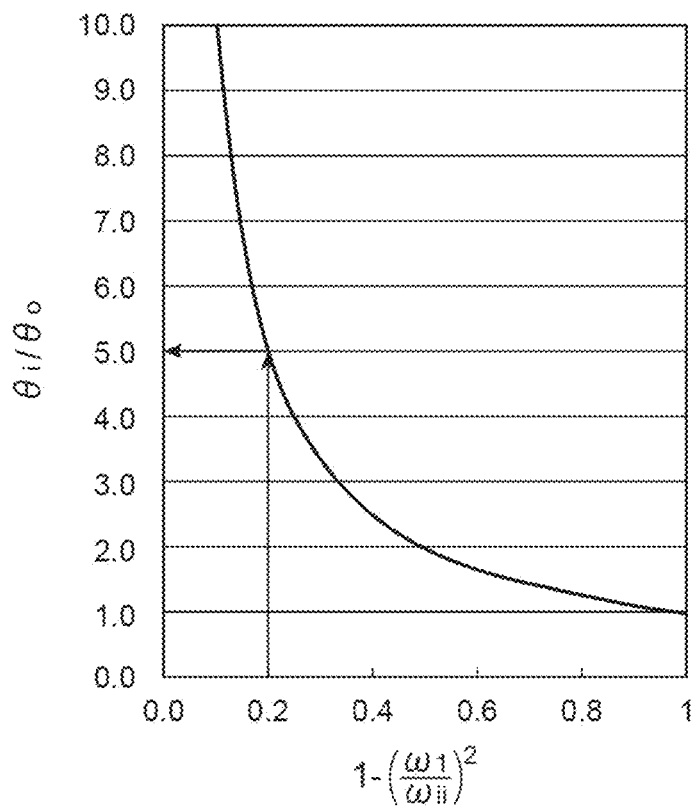
FIGS. 8(a) and 8(b) are graphs showing relationships between numerical values in the case of outer drive.
Figure 8:
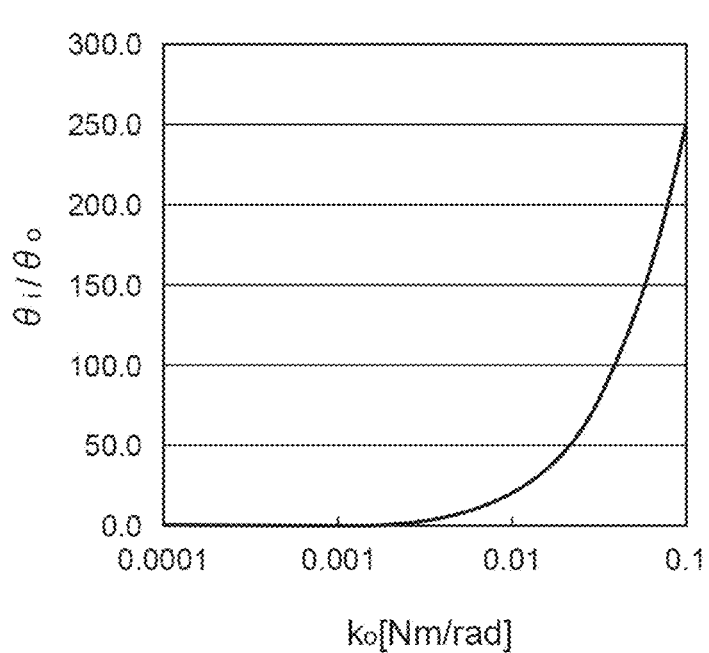

FIGS. 8(a) and 8(b) are graphs showing relationships between numerical values when the mirror surface 10 is operated at the natural angular frequency $\omega_1$ in the case of outer drive. FIG. 8(a) shows a relationship between $1-(\omega_1/\omega_{ii})^2$ and the amplitude ratio $\theta_i/\theta_o$, and FIG. 8(b) shows a relationship between the torsional spring constant $k_o$ of each of the second connection portions 7 and 8 and the amplitude ratio $\theta_i/\theta_o$. As shown in FIG. 8(a), when the mirror device is designed and produced to satisfy equation (22), the amplitude ratio can be 5 or more. As shown in FIG. 8(b), as the torsional spring constant $k_o$ increases, the amplitude ratio increases. Therefore, the torsional spring constant $k_o$ is increased, so that the amplitude ratio can be greatly secured.

Figure 9:
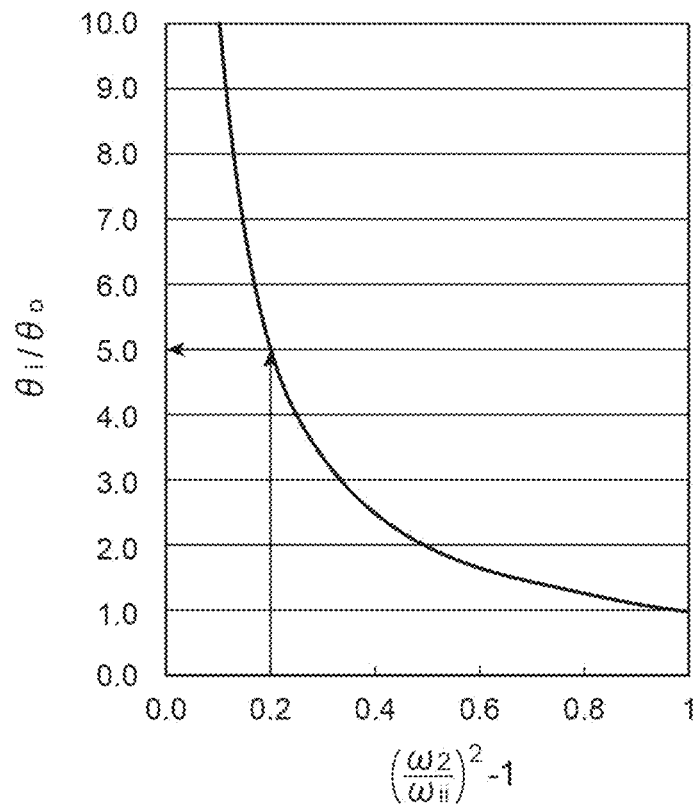
FIGS. 9(a) and 9(b) are graphs showing a relationship between the numerical values in the case of outer drive.
Figure 9:
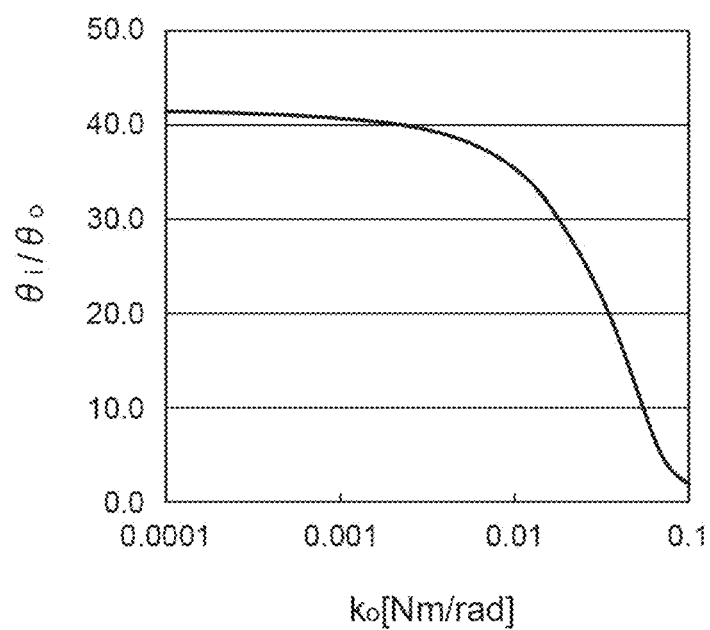

FIGS. 9(a) and 9(b) are graphs showing relationships between numerical values when the mirror surface 10 is operated at the natural angular frequency $\omega_2$ in the case of outer drive. FIG. 9(a) shows a relationship between $1-(\omega_2/\omega_{ii})^2$ and the amplitude ratio $\theta_i/\theta_o$, and FIG. 9(b) shows a relationship between the torsional spring constant $k_o$ of the second connection portions 7 and 8 and the amplitude ratio $\theta_i/\theta_o$. As shown in FIG. 9(a), when the mirror device is designed and produced to satisfy equation (23), the amplitude ratio can be 5 or more. As shown in FIG. 9(b), as the torsional spring constant $k_o$ increases, the amplitude ratio decreases. Therefore, the torsional spring constant $k_o$ is decreased, so that the amplitude ratio can be greatly secured.

Here, when the values of the natural angular frequencies $\omega_1$ and $\omega_2$ are close to each other, and the difference between the natural angular frequencies $\omega_1$ and $\omega_2$ is small, both of equations (22) and (23) are satisfied. However, when the difference between the natural angular frequencies $\omega_1$ and $\omega_2$ is small, for example, when the mirror surface 10 is operated at the natural angular frequency $\omega_1$, a resonance response is generated at the natural angular frequency $\omega_2$, so that the operation of the mirror surface 10 is unstable. Therefore, in the method for producing the mirror device of the present embodiment, in the case of outer drive, the mirror device is designed and produced to satisfy only one of equations (22) and (23) but not to satisfy the other. As a result, the difference between the natural angular frequencies $\omega_1$ and $\omega_2$ can be greatly secured, and an unnecessary resonance response can be suppressed to stabilize the operation. This point is common to when the mirror surface 10 is operated at either of the natural angular frequencies $\omega_1$ and $\omega_2$.

For example, in the mirror device 1B according to the second embodiment, only equation (22) is satisfied and equation (23) is not satisfied. Therefore, the mirror surface 10 is operated at the natural angular frequency $\omega_1$, so that the amplitude ratio can be 5 or more. In addition, the difference between the natural angular frequencies $\omega_1$ and $\omega_2$ can be greatly secured, and an unnecessary resonance response can be suppressed to stabilize the operation.

[Case of Inner Drive]

Next, as in the mirror device 1A, a case where a drive force is applied to the first movable portion 3 to cause the first movable portion 3 to resonate (case of inner drive) will be described. In this case, the equations of motion for the vibration of the first movable portion 3 and the second movable portion 4 around the X-axis are expressed by the following equations (24) and (25).

[Equation 24]

$$j_i \frac{d^2\theta_i}{dt^2} + c_i \frac{d\theta_i}{dt} + k_i(\theta_i - \theta_0) = T_i \cos(\omega t) \quad (24)$$

[Equation 25]

$$j_o \frac{d^2\theta_o}{dt^2} + c_o \frac{d\theta_o}{dt} + (k_i - k_0)\theta_0 - k_i\theta_i = T_o \cos(\omega t) = 0 \quad (25)$$

In the case of inner drive, since a drive force for driving the first movable portion 3 is not applied to the second movable portion 4 (namely, since $T_o=0$), the right side of equation (25) is 0.

The deflection angle $\theta_i$ of the first movable portion 3 and the deflection angle $\theta_o$ of the second movable portion 4 are obtained from equations (24) and (25) as expressed in the following equations (26) and (27).

[Equation 26]

$$\theta_i = \frac{T_i}{j_i\omega_{ii}^2}\sqrt{\frac{1}{\left(-\beta_{ii}^2+1+B\right)^2+\left(2\beta_{ii}\zeta_i+C\right)^2}} \quad (26)$$

[Equation 27]

$$\theta_o = \frac{T_i}{j_i\omega_{ii}^2}\sqrt{\frac{B^2+C^2}{\left(-\beta_{ii}^2+1+B\right)^2+\left(2\beta_{ii}\zeta_i+C\right)^2}} \quad (27)$$

[Equation 28]

$$B = \frac{\beta_{io}^2\left(1-\beta_{oo}^2+\beta_{io}^2\right)}{\left(1-\beta_{oo}^2+\beta_{io}^2\right)^2+4\beta_{oo}^2\zeta_o^2} \quad (28)$$

-continued

[Equation 29]

$$C = \frac{2\beta_{oo} + \beta_{io}^2}{\left(1 - \beta_{oo}^2 + \beta_{io}^2\right)^2 + 4\beta_{oo}^2 \zeta_o^2} \quad (29)$$

In this case, the amplitude ratio $\theta_i/\theta_o$ is expressed by the following equation (30).

[Equation 30]

$$\frac{\theta_i}{\theta_o} = \frac{1}{\sqrt{\frac{\beta_{io}^4}{\left(1 - \beta_{oo}^2 + \beta_{io}^2\right)^2 + 4\beta_{oo}^2 \zeta_o^2}}} \approx$$

$$\frac{1}{\sqrt{\frac{\beta_{io}^4}{\left(1 - \beta_{oo}^2 + \beta_{io}^2\right)^2}}} = \frac{1}{\sqrt{\frac{\left(\frac{\omega_{io}}{w_{oo}}\right)^4}{\left\{1 - \left(\frac{\omega_{io}}{w_{oo}}\right)^2 + \left(\frac{\omega}{w_{oo}}\right)^2\right\}^2}}} \quad (\because \zeta_o \ll 1) \quad (30)$$

Therefore, the condition for setting the amplitude ratio to 5 or more is expressed by the following equation (31).

[Equation 31]

$$\frac{\theta_i}{\theta_o} \approx \frac{1}{\sqrt{\frac{\left(\frac{\omega_{io}}{w_{oo}}\right)^4}{\left\{1 - \left(\frac{\omega_{io}}{w_{oo}}\right)^2 + \left(\frac{\omega}{w_{oo}}\right)^2\right\}^2}}} \geq 5 \quad (31)$$

When the mirror surface 10 is operated at the natural angular frequency $\omega_1$ of the resonance point A (namely, when $\omega=\omega_1$), since $1-(\omega_{io}/\omega_{oo})^2+(\omega_1/\omega_{oo})^2$ is larger than 0, the condition for setting the amplitude ratio to 5 or more is expressed by the following equation (32).

[Equation 32]

$$0 < \frac{4\omega_{io}^2}{\omega_{oo}^2 - \omega_1^2} \leq 1 \quad (32)$$

Meanwhile, when the mirror surface 10 is operated at the natural angular frequency $\omega_2$ of the resonance point B (namely, when $\omega=\omega_2$), since $1-(\omega_{io}/\omega_{oo})^2+(\omega_2/\omega_{oo})^2$ is smaller than 0, the condition for setting the amplitude ratio to 5 or more is expressed by the following equation (33).

[Equation 33]

$$\frac{\omega_{oo}^2 - \omega_2^2}{\omega_{io}^2} \leq -6 \quad (33)$$

Namely, when the mirror surface 10 is operated at the natural angular frequency $\omega_1$, the mirror device is designed and produced to satisfy equation (32), so that the amplitude ratio can be 5 or more, and when the mirror surface 10 is operated at the natural angular frequency $\omega_2$, the mirror device is designed and produced to satisfy equation (33), so that the amplitude ratio can be 5 or more. The point that the mirror device is designed and produced to satisfy only one of equations (32) and (33) but not to satisfy the other, so that the difference between the natural angular frequencies $\omega_1$ and $\omega_2$ can be greatly secured, and an unnecessary resonance response can be suppressed to stabilize the operation is the same as in the case of outer drive.

Figure 10:
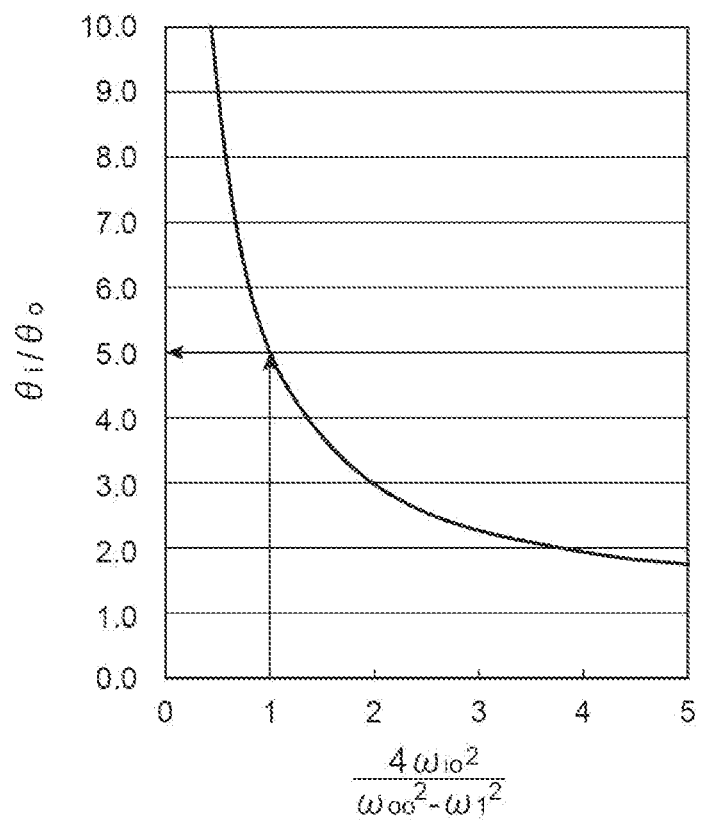
FIGS. 10(a) and 10(b) are graphs showing relationships between numerical values in the case of inner drive.
Figure 10:
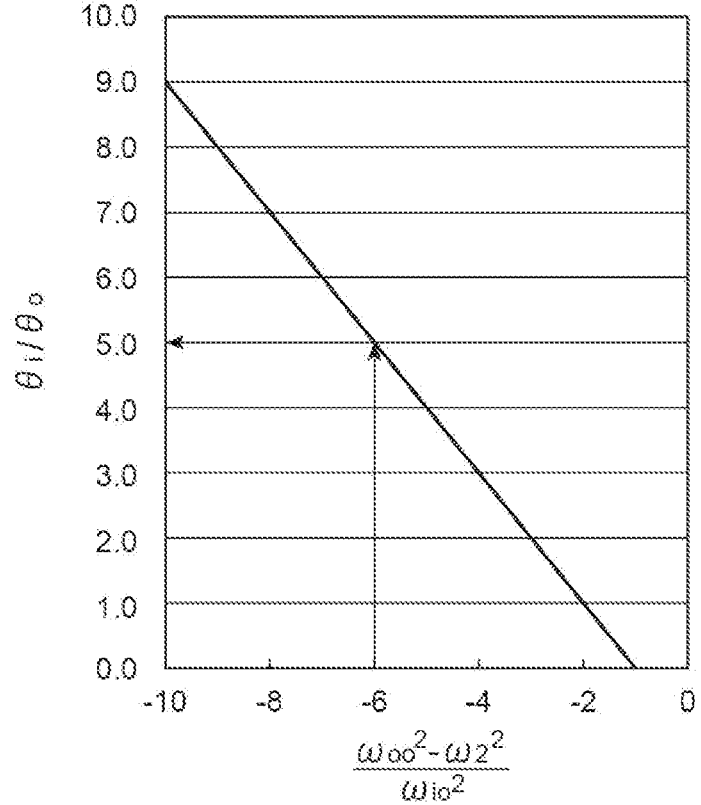

FIGS. 10(*a*) and 10(*b*) are graphs showing relationships between numerical values in the case of inner drive. FIG. 10(*a*) shows a relationship between $4\omega_{io}^2/(\omega_{oo}^2-\omega_1^2)$ and the amplitude ratio $\theta_i/\theta_o$ when the mirror surface 10 is operated at the natural angular frequency $\omega_1$, and FIG. 10(*b*) shows a relationship between $(\omega_{oo}^2-\omega_2^2)/\omega_{io}^2$ and the amplitude ratio $\theta_i/\theta_o$ when the mirror surface 10 is operated at the natural angular frequency $\omega_2$.

As shown in FIG. 10(*a*), when the mirror device is designed and produced to satisfy equation (32), the amplitude ratio can be 5 or more. In addition, in the case of inner drive, when the mirror surface 10 is operated at the natural angular frequency $\omega_1$, similarly to the case of outer drive (FIG. 8(*b*)), as the torsional spring constant $k_o$ increases, the amplitude ratio increases. Therefore, the torsional spring constant $k_o$ is increased, so that the amplitude ratio can be greatly secured.

As shown in FIG. 10(*b*), when the mirror device is designed and produced to satisfy equation (33), the amplitude ratio can be 5 or more. In addition, in the case of inner drive, when the mirror surface 10 is operated at the natural angular frequency $\omega_2$, similarly to the case of outer drive (FIG. 9(*b*)), as the torsional spring constant $k_o$ increases, the amplitude ratio decreases. Therefore, the torsional spring constant $k_o$ is decreased, so that the amplitude ratio can be greatly secured.

For example, in the mirror device 1A according to the first embodiment, only equation (33) is satisfied and equation (32) is not satisfied. Therefore, the mirror surface 10 is operated at the natural angular frequency $\omega_2$, so that the amplitude ratio can be 5 or more. In addition, the difference between the natural angular frequencies $\omega_1$ and $\omega_2$ can be greatly secured, and an unnecessary resonance response can be suppressed to stabilize the operation.

[Functions and Effects]

As described above, in the mirror device 1A, since two natural angular frequencies $\omega_1$ and $\omega_2$ satisfy only equation (33) (first equation) and do not satisfy equation (32) (second equation), the first movable portion 3 and the second movable portion 4 swing at the natural angular frequency $\omega_2$, so that the amplitude ratio can be 5 or more. Therefore, the amplitude ratio can be greatly secured, and the efficiency of the operation can be improved. Furthermore, since only equation (33) is satisfied and equation (32) is not satisfied, the difference between the natural angular frequencies $\omega_1$ and $\omega_2$ can be greatly secured, and an unnecessary resonance response can be suppressed to stabilize the operation. As a result, according to the mirror device 1A, a highly efficient and stable operation can be implemented.

In the mirror device 1B, since the two natural angular frequencies $\omega_1$ and $\omega_2$ satisfy only equation (22) (first equation) and do not satisfy equation (23) (second equation), the first movable portion 3 and the second movable portion 4 swing at the natural angular frequency $\omega_1$, so that the amplitude ratio can be 5 or more. Therefore, the amplitude ratio can be greatly secured, and the efficiency of the operation can be improved. Furthermore, since only equation (22) is satisfied and equation (23) is not satisfied, the difference between the natural angular frequencies $\omega_1$ and $\omega_2$ can be greatly secured, and an unnecessary resonance response can be suppressed to stabilize the operation. As a result, according to the mirror device 1B, a highly efficient and stable operation can be implemented.

In the mirror device 1A, each of the second connection portions 7 and 8 connects the second movable portion 4 and the support portion 2 to each other such that the second movable portion 4 is swingable around the Y-axis. For this reason, the second movable portion 4 is swingable around the Y-axis, together with the first movable portion 3.

In the mirror device 1B, the torsional spring constant of each of the second connection portions 7 and 8 around the X-axis is larger than the torsional spring constant of each of the first connection portions 5 and 6 around the X. For this reason, the amplitude ratio can be more greatly secured.

In the mirror device 1B, the total length of each of the second connection portions 7 and 8 is shorter than the total length of each of the first connection portions 5 and 6. For this reason, the torsional spring constant of the second connection portions 7 and 8 can be suitably made larger than the torsional spring constant of the first connection portions 5 and 6. Furthermore, instead of increasing the cross-sectional areas of the second connection portions 7 and 8, the lengths of the second connection portions 7 and 8 are shortened to increase the torsional spring constant of the second connection portions 7 and 8; and thereby, while the size of the mirror device 1B is reduced, the amplitude ratio can be greatly secured.

In the mirror device 1B, the first member 7a and the pair of second members 7b (a plurality of members) are disposed side by side along the direction parallel to the Y-axis. For this reason, the torsional spring constant of the second connection portions 7 and 8 can be more suitably made larger than the torsional spring constant of the first connection portions 5 and 6.

In the mirror device 1B, each of the second connection portions 7 and 8 includes the first member 7a disposed on the X-axis, and the pair of second members 7b disposed to interpose the first member 7a therebetween. For this reason, the torsional spring constant of the second connection portions 7 and 8 can be more suitably made larger than the torsional spring constant of the first connection portions 5 and 6.

In the mirror device 1B, each of the wirings 14 and 16 is disposed to pass through the first member 7a. Since the wirings 14 and 16 are disposed to pass through the first member 7a which is subjected to a smaller stress than the second member 7b during vibration of the second movable portion 4, deterioration of the wirings 14 and 16 in the second connection portion 7 can be suppressed.

In the mirror device 1A, the torsional spring constant of each of the second connection portions 7 and 8 around the X-axis is smaller than the torsional spring constant of each of the first connection portions 5 and 6 around the X. For this reason, the amplitude ratio can be more greatly secured.

In the mirror device 1A, the total length of each of the second connection portions 7 and 8 is longer than the total length of each of the first connection portions 5 and 6. For this reason, the torsional spring constant of the second connection portions 7 and 8 can be suitably made smaller than the torsional spring constant of the first connection portions 5 and 6.

In the mirror device 1A, each of the second connection portions 7 and 8 extends in a meandering manner. For this reason, the torsional spring constant of the second connection portions 7 and 8 can be more suitably made smaller than the torsional spring constant of the first connection portions 5 and 6. Furthermore, since each of the second connection portions 7 and 8 extends in a meandering manner, impact resistance can be further improved, for example, as compared to when each of the second connection portions 7 and 8 extends linearly.

In the mirror devices 1A and 1B, the support portion 2, the first movable portion 3, the second movable portion 4, the first connection portions 5 and 6, and the second connection portions 7 and 8 are configured by a semiconductor substrate. Even in the mirror devices 1A and 1B configured in such a manner, a highly efficient and stable operation can be implemented.

In the mirror device 1B, the portion of the wiring 16, the portion being located on each of the first connection portions 5 and 6, is configured by the diffusion region 41 where impurities are diffused in a semiconductor material. A relatively large stress is applied to the portion of the wiring 16 during swinging of the first movable portion 3, the portion being located on the first connection portions 5 and 6; however, since the portion is configured by the diffusion region 41, deterioration of the wiring in the first connection portions 5 and 6 can be suppressed. Namely, when the portion is configured by the diffusion region 41, metal fatigue, cracks, or the like can be further suppressed, and reliability can be further improved, for example, as compared to when the portion is made of metal. Incidentally, since the wiring 16 is connected to the coil 24 for electromotive force monitoring, a relatively smaller current flows through the wiring 16 than through, for example, a wiring connected to a drive coil. For this reason, an extreme reduction in resistance of the wiring 16 is not required.

In the mirror device 1B, the width of the diffusion region 41 in the first movable portion 3 and the second movable portion 4 (the width W1 of the end portion 41a and the width W2 of the end portion 41b) is wider than the width of the diffusion region 41 in the first connection portions 5 and 6. For this reason, the resistance of the wiring 16 can be reduced.

In the mirror device 1B, the inner portion 16a and the outer portion 16b of the wiring 16 are made of a metallic material, the inner portion 16a being located on the first movable portion 3 and the outer portion 16b being located on the second movable portion 4. Then, the width W4 of the contact portion between the diffusion region 41 and the inner portion 16a and the width W5 of the contact portion between the diffusion region 41 and the outer portion 16b are wider than the width W3 of each of the first connection portions 5 and 6. For this reason, the resistance of the wiring 16 can be further reduced. In addition, even when a misalignment is generated during production or the like, the diffusion region 41 can be reliably electrically connected to each of the inner portion 16a and the outer portion 16b.

Modification Examples

The embodiments of the present disclosure have been described above; however, the present disclosure is not limited to the embodiments. In the mirror device 1A of the first embodiment, a drive force may be applied to the second movable portion 4 to cause the first movable portion 3 to resonate. Namely, the structure of the mirror device 1A may be used for outer drive. In this case, the first movable portion 3 may not be provided with the coil 21, and the second movable portion 4 may be provided with a coil for resonance operation of the first movable portion 3 in addition to being provided with the coil 22. Similarly to the case of the mirror device 1B, in addition to a Lorentz force generated by interaction between magnetic fields generated by the coil for resonance operation and the magnetic field generation unit 9, the resonance of the first movable portion 3 at the resonance frequency can be used to cause the mirror surface 10 to resonate around the X-axis. Incidentally, the coil for resonance operation may not be provided, and the coil 22 may be used as a coil for the linear operation of the second movable portion 4 and the resonance operation of the first movable portion 3. Such a mirror device is designed and provided to satisfy only equation (23) but not to satisfy equation (22). As a result, the mirror surface 10 is operated at the natural angular frequency $\omega_2$, so that the amplitude ratio can be 5 or more. In addition, the difference between the natural angular frequencies $\omega_1$ and $\omega_2$ can be greatly secured, and an unnecessary resonance response can be suppressed to stabilize the operation.

In the mirror device 1B of the second embodiment, a drive force may be applied to the first movable portion 3 to cause the first movable portion 3 to resonate. Namely, the structure of the mirror device 1B may be used for inner drive. In this case, the second movable portion 4 may not be provided with the coil 22, and the first movable portion 3 may be provided with a drive coil instead of or in addition to being provided with the coil 24. Similarly to the case of the mirror device 1A, in addition to a Lorentz force generated by interaction between magnetic fields generated by the drive coil and the magnetic field generation unit 9, the resonance of the first movable portion 3 at the resonance frequency can be used to cause the mirror surface 10 to resonate around the X-axis. Such a mirror device is designed and provided to satisfy only equation (32) but not to satisfy equation (33). As a result, the mirror surface 10 is operated at the natural angular frequency $\omega_1$, so that the amplitude ratio can be 5 or more. In addition, the difference between the natural angular frequencies $\omega_1$ and $\omega_2$ can be greatly secured, and an unnecessary resonance response can be suppressed to stabilize the operation.

In the mirror devices 1A and 1B, the mirror surface 10 is driven by an electromagnetic force; however, the mirror surface 10 may be driven by a piezoelectric element or an electrostatic force. In this case, instead of a coil, another drive element such as a piezoelectric film or electrostatic comb teeth is provided. In the mirror device 1A, the second connection portions 7 and 8 may extend along the X-axis to connect the second movable portion 4 and the support portion 2 to each other on the X-axis. Even in this case, the first movable portion 3 is swingable around each of the X-axis and the Y-axis. In the mirror device 1A, the second connection portions 7 and 8 may connect the second movable portion 4 and the support portion 2 to each other such that the second movable portion 4 is swingable around the second axis intersecting the first axis. Namely, the second axis may not necessarily be orthogonal to the first axis. In the mirror device 1B, the second member 7b may extend obliquely with respect to the X-axis. The second member 7b may extend along the direction parallel to the Y-axis, to connect the second movable portion 4 and the support portion 2 to each other. In the above example, the lower limit value of the amplitude ratio is set to 5; however, the lower limit value may be set to 10. In the mirror device 1B, the coil 24 may be used as a temperature detection coil (sensing coil).

In the mirror device 1A, a drive unit (the coil 21 or a drive element) which applies a drive force to the first movable portion 3 is provided in the first movable portion 3; however, the drive unit may be provided in the first movable portion 3 and/or the first connection portions 5 and 6, for example, may be provided in each of the first connection portions 5 and 6. In the mirror devices 1A and 1B, a drive unit (the coil 22 or a drive element) which applies a drive force to the second movable portion 4 is provided in the second movable portion 4; however, the drive unit may be provided in the second movable portion 4 and/or the second connection portions 7 and 8, for example, may be provided in each of the second connection portions 7 and 8.

In the mirror devices 1A and 1B, the first movable portion 3 and/or the first connection portions 5 and 6 may be provided with a first drive element (for example, coil) that directly applies a drive force to the first movable portion 3, and the second movable portion 4 and/or the second connection portions 7 and 8 may be provided with a second drive element (for example, coil) that directly applies a drive force to the second movable portion 4. In such a configuration, the mirror surface 10 (first movable portion 3) can be resonated around the X-axis by both of the drive force which is directly applied to the first movable portion 3 by the first drive element and the drive force which is directly applied to the first movable portion 3 by the vibration of the second movable portion 4 induced by the second drive element (by cooperation of both). When the mirror device 1A adopts the configuration, for example, the first movable portion 3 is provided with a coil that causes the first movable portion 3 to swing around the X-axis, and the second movable portion 4 is provided with a coil that causes the second movable portion 4 to swing around the Y-axis, and a coil that vibrates the second movable portion 4 to cause the first movable portion 3 to swing around the X. When the mirror device 1B adopts the configuration, for example, the first movable portion 3 is provided with a coil that causes the first movable portion 3 to swing around the X-axis, and the second movable portion 4 is provided with a coil that vibrates the second movable portion 4 to cause the first movable portion 3 to swing around the X. Incidentally, when the mirror device 1B adopts the configuration, the mirror surface 10 (first movable portion 3) can be resonated around the X-axis by the drive force which is directly applied to the first movable portion 3 by the first drive element, and the second movable portion 4 can be operated around the X-axis by the drive force which is directly applied to the second movable portion 4 by the second drive element (namely, the configuration is also applicable to inner drive).

The materials and the shapes of the configurations are not limited to the materials and the shapes described above, and various materials and shapes can be adopted. The first movable portion 3 and the second movable portion 4 may have any external shape such as a substantially circular shape, a substantially elliptical shape, a substantially quadrilateral shape, or a substantially diamond shape in plan view. The frame 3b may not be provided, and the first connection portions 5 and 6 may be directly connected to the main body portion 3a. At least one of the pair of widened portions 5b may not be provided in the first connection portion 5, and at least one of the pair of widened portions 6b may not be provided in the first connection portion 6. The first movable portion 3 may have an optical surface other than the mirror surface 10, and may have, for example, a diffraction grating surface. Namely, an actuator device of the present disclosure may be a device that drives a surface other than the mirror surface 10.

Figure 11:
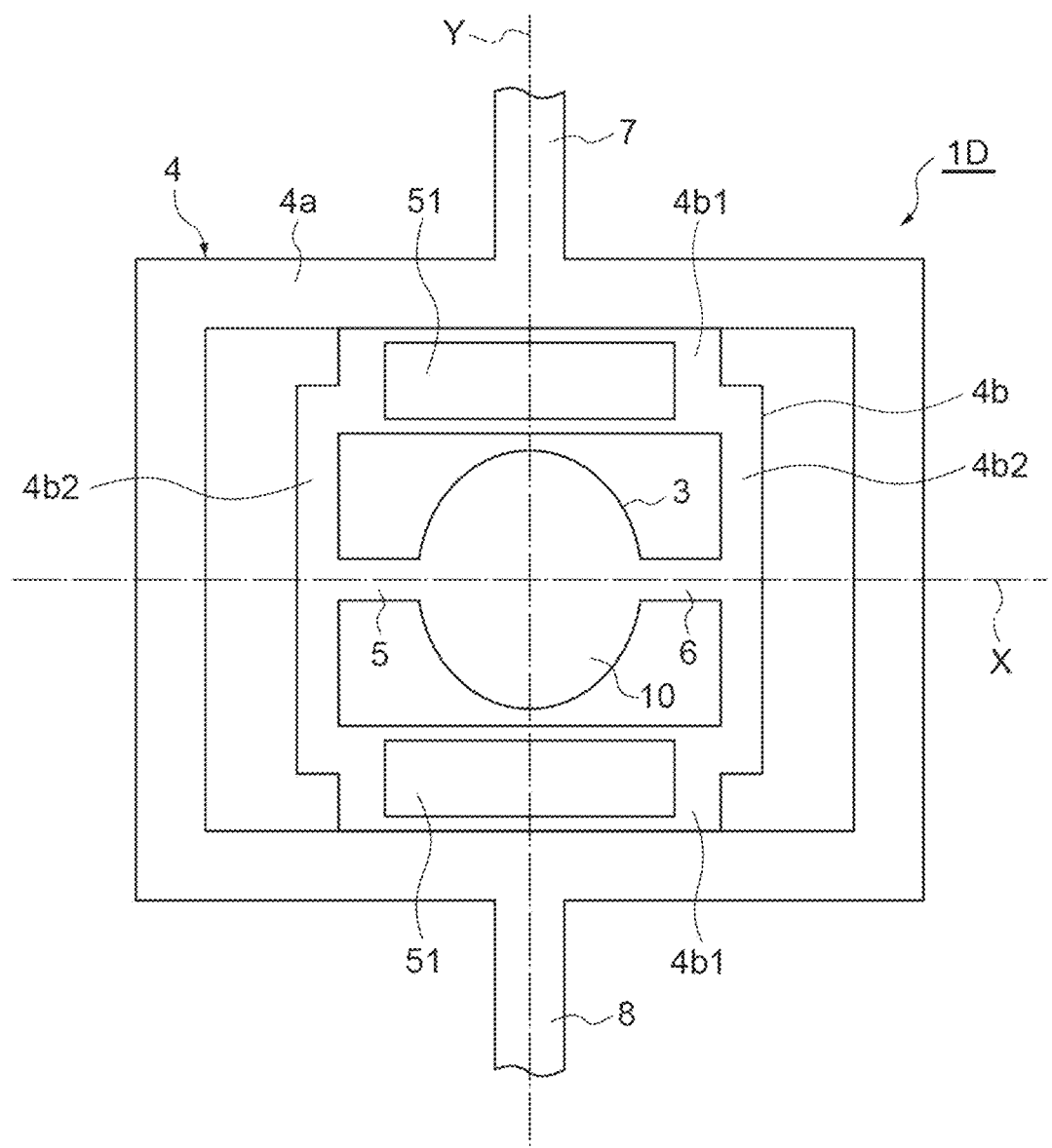
FIG. 11 is a plan view of a mirror device according to a first modification example.

In a mirror device 1D of a first modification example illustrated in FIG. 11, the first movable portion 3 swings around each of the X-axis and the Y-axis orthogonal to each other. The first movable portion 3 is formed, for example, in an elliptical shape in plan view. The first connection portions 5 and 6 extend linearly along the X-axis. The second connection portions 7 and 8 extend linearly along the Y-axis.

The second movable portion 4 includes a frame-shaped portion 4a surrounding the first movable portion 3, and an intermediate portion 4b connected to the frame-shaped portion 4a.

The frame-shaped portion 4a has a quadrilateral external shape in plan view. The intermediate portion 4b has, for example, a substantially quadrilateral external shape in plan view, and is formed in a frame shape. The intermediate portion 4b includes a pair of first portions 4b1, and a pair of second portions 4b2 connected to the pair of first portions 4b1. The pair of first portions 4b1 extend along a direction parallel to the X-axis, and face each other in the Y-axis direction. The pair of second portions 4b2 extend along a direction parallel to the Y-axis, and face each other in the X-axis direction. The width (length in the Y-axis direction) of the first portion 4b1 is wider than the width (length in the X-axis direction) of the second portion 4b2. The intermediate portion 4b is disposed inside the frame-shaped portion 4a, and is connected to the frame-shaped portion 4a in the first portion 4b1. The intermediate portion 4b is connected to the first connection portions 5 and 6 in the second portions 4b2.

In the mirror device 1D, a pair of piezoelectric films 51 are provided as drive units that applies a drive force to the first movable portion 3. The pair of piezoelectric films 51 are disposed on the pair of first portions 4b1 of the intermediate portion 4b. Each of the piezoelectric films 51 has, for example, a rectangular shape having a long side along the direction parallel to the X-axis in plan view.

In the mirror device 1D, when a drive signal is input to the piezoelectric films 51 via electrode pads and wirings (unillustrated), the piezoelectric films 51 are flexed in a longitudinal direction. The timing of deformation of the pair of piezoelectric films 51 is controlled, so that a drive force can be applied to the intermediate portion 4b (second movable portion 4). For example, the pair of piezoelectric films 51 are alternately flexed. The rigidity of the intermediate portion 4b is smaller than the rigidity of the frame-shaped portion 4a, and the intermediate portion 4b is more flexible than the frame-shaped portion 4a.

In the mirror device 1D, the drive of the first movable portion 3 is outer drive by which a drive force is applied to the second movable portion 4 to cause the first movable portion 3 to resonate. Even in the mirror device 1D, similarly to the mirror device 1B, when the mirror surface 10 is operated at a first natural angular frequency $\omega_1$, the mirror device is designed and produced to satisfy equation (22), so that the amplitude ratio can be 5 or more, and when the mirror surface 10 is operated at the natural angular frequency $\omega_2$, the mirror device is designed and produced to satisfy equation (23), so that the amplitude ratio can be 5 or more. In addition, the mirror device is designed and produced to satisfy only one of equations (22) and (23) but not to satisfy the other, so that the difference between the natural angular frequencies $\omega_1$ and $\omega_2$ can be greatly secured, and an unnecessary resonance response can be suppressed to stabilize the operation. Even in the mirror device 1D, similarly to the mirror device 1B, a highly efficient and stable operation can be implemented.

Figure 12:
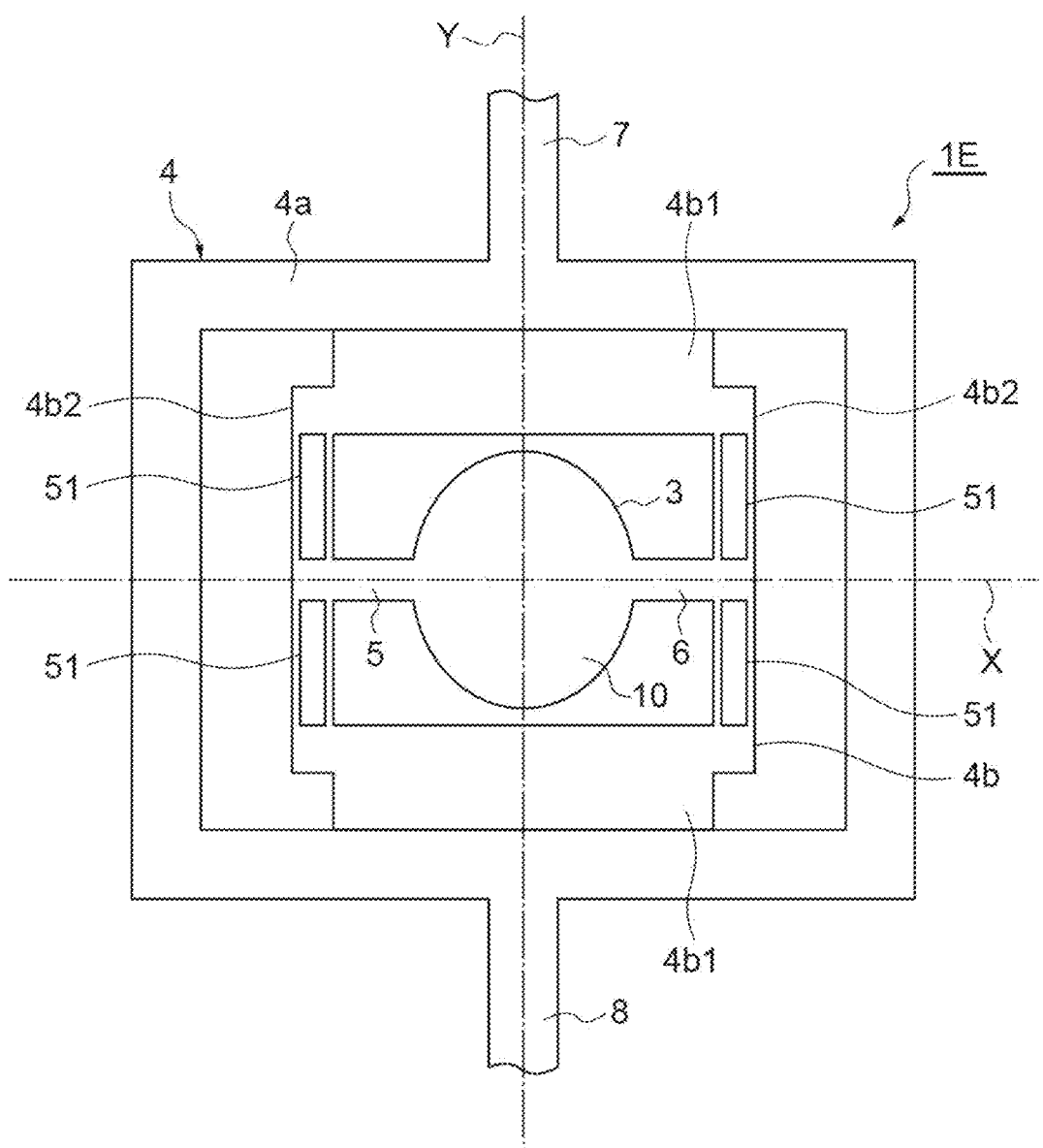
FIG. 12 is a plan view of a mirror device according to a second modification example.

A mirror device 1E of a second modification example illustrated in FIG. 12 differs from the mirror device 1D in that the piezoelectric film 51 is disposed on the second portion 4b2 of the intermediate portion 4b. Specifically, a pair of the piezoelectric films 51 are disposed side by side in the direction parallel to the Y-axis on a pair of the second portions 4b2. Even in the mirror device 1E, the timing of deformation of each of the piezoelectric films 51 is controlled, so that a drive force can be applied to the intermediate portion 4b (second movable portion 4). Even in the mirror device 1E, similarly to the mirror device 1B, a highly efficient and stable operation can be implemented.

REFERENCE SIGNS LIST 1A, 1B, 1C: mirror device (actuator device), 2: support portion, 3: first movable portion, 4: second movable portion, 5, 6: first connection portion, 7, 8: second connection portion, 7a: first member, 7b: second member, 9: magnetic field generation unit (drive unit), 14, 15, 16, 17: wiring, 16a: inner portion, 16b: outer portion, 41: diffusion region, 21: coil (drive unit), 22: coil (drive unit), 24: coil (electromotive force monitoring coil or sensing coil).

The invention claimed is:

1. An actuator device comprising:
a support portion;
a first movable portion;
a second movable portion that has a frame shape and surrounds the first movable portion;
a first connection portion that connects the first movable portion and the second movable portion to each other such that the first movable portion is swingable around a first axis;
a second connection portion that connects the second movable portion and the support portion to each other such that the first movable portion is swingable around the first axis by vibrating the second movable portion; and
a drive unit that applies a drive force to the second movable portion,
wherein two natural angular frequencies $\omega_1$ and $\omega_2$ (where $\omega_1 < \omega_2$) for vibration of the first movable portion and the second movable portion around the first axis satisfy one of the following first equation (1) and second equation (2) and do not satisfy the other,

[Equation 1]
$$0 < 1 - \left(\frac{\omega_1}{\omega_{ii}}\right)^2 \leq 0.2 \tag{1}$$

[Equation 2]
$$0 < \left(\frac{\omega_2}{\omega_{ii}}\right)^2 - 1 \leq 0.2 \tag{2}$$

where in the above equations, $\omega_{ii} = (k_i/j_i)^{1/2}$, $k_i$ is a torsional spring constant of the first connection portion around the first axis, and $j_i$ is an inertia moment of the first movable portion around the first axis.

2. The actuator device according to claim 1,
wherein the second connection portion connects the second movable portion and the support portion to each other such that the second movable portion is swingable around a second axis intersecting the first axis.

3. The actuator device according to claim 1,
wherein the two natural angular frequencies satisfy the first equation and do not satisfy the second equation, and
a torsional spring constant of the second connection portion around the first axis is larger than the torsional spring constant of the first connection portion around the first axis.

4. The actuator device according to claim 3,
wherein a total length of the second connection portion is shorter than a total length of the first connection portion.

5. The actuator device according to claim 3,
wherein the second connection portion includes a plurality of members, each of which connects the second movable portion and the support portion to each other, and
the plurality of members are disposed side by side along a direction intersecting the first axis.

6. The actuator device according to claim 5,
wherein the plurality of members include a first member disposed on the first axis, and a pair of second members disposed to interpose the first member between the second members.

7. The actuator device according to claim 6, further comprising:
a wiring extending from the second movable portion to the support portion via the second connection portion,
wherein the wiring is disposed to pass through the first member.

8. The actuator device according to claim 1,
wherein the two natural angular frequencies satisfy the second equation and do not satisfy the first equation, and
a torsional spring constant of the second connection portion around the first axis is smaller than the torsional spring constant of the first connection portion around the first axis.

9. The actuator device according to claim 8,
wherein a total length of the second connection portion is longer than a total length of the first connection portion.

10. The actuator device according to claim 8,
wherein the second connection portion extends in a meandering manner.

11. The actuator device according to claim 1,
wherein the support portion, the first movable portion, the second movable portion, the first connection portion, and the second connection portion are configured by a semiconductor substrate.

12. The actuator device according to claim 1, further comprising:
a sensing coil provided in the first movable portion; and
a wiring that is connected to the sensing coil and extends to the second movable portion via the first connection portion,
wherein the first connection portion is made of a semiconductor material, and
a portion of the wiring, the portion being located on the first connection portion, is configured by a diffusion region where impurities are diffused in the semiconductor material.

13. The actuator device according to claim 12,
wherein the diffusion region extends from the first connection portion to the first movable portion and the second movable portion, and
a width of the diffusion region in the first movable portion and the second movable portion is wider than a width of the diffusion region in the first connection portion.

14. The actuator device according to claim 12,
wherein a portion of the wiring, the portion being located on the first movable portion, and a portion of the wiring, the portion being located on the second movable portion, are made of a metallic material, and
a width of a contact portion between the diffusion region and each of the portion located on the first movable portion and the portion located on the second movable portion is wider than a width of the first connection portion.

15. The actuator device according to claim 1,
wherein the first connection portion includes a widened portion whose width increases as approaching the first movable portion when seen in a direction perpendicular to a plane on which the support portion, the first movable portion, and the second movable portion are disposed and the first connection portion is connected to the first movable portion at the widened portion.

16. The actuator device according to claim 1,
wherein the first connection portion includes a widened portion whose width increases as approaching the second movable portion when seen in a direction perpendicular to a plane on which the support portion, the first movable portion, and the second movable portion are disposed and the first connection portion is connected to the second movable portion at the widened portion.

17. The actuator device according to claim 1,
wherein the first connection portion includes a first widened portion whose width increases as approaching the first movable portion and a second widened portion whose width increases as approaching the second movable portion when seen in a direction perpendicular to a plane on which the support portion, the first movable portion, and the second movable portion are disposed and the first connection portion is connected to the first movable portion at the first widened portion and is connected to the second movable portion at the second widened portion.

18. An actuator device comprising:
a support portion;
a first movable portion;
a second movable portion that has a frame shape and surrounds the first movable portion
a first connection portion that connects the first movable portion and the second movable portion to each other such that the first movable portion is swingable around a first axis;
a second connection portion that connects the second movable portion and the support portion to each other; and
a drive unit provided in at least one of the first movable portion and the first connection portion to apply a drive force to the first movable portion,
wherein two natural angular frequencies $\omega_1$ and $\omega_2$ (where $\omega_1 < \omega_2$) for vibration of the first movable portion and the second movable portion around the first axis satisfy one of the following first equation (3) and second equation (4) and do not satisfy the other,

[Equation 3]
$$0 < \frac{4\omega_{io}^2}{\omega_{oo}^2 - \omega_1^2} \leq 1 \tag{3}$$

[Equation 4]
$$\frac{\omega_{oo}^2 - \omega_2^2}{\omega_{io}^2} \leq -6 \tag{4}$$

where in the above equations, $\omega_{io} = (k_i/j_o)^{1/2}$, $\omega = (k_o/j_o)^{1/2}$, $k_i$ is a torsional spring constant of the first connection portion around the first axis, $k_o$ is a torsional spring constant of the second connection portion around the first axis, and $j_o$ is an inertia moment of the second movable portion around the first axis.

19. The actuator device according to claim 18, wherein the two natural angular frequencies satisfy the first equation and do not satisfy the second equation, and a torsional spring constant of the second connection portion around the first axis is larger than the torsional spring constant of the first connection portion around the first axis.

20. The actuator device according to claim 18, wherein the two natural angular frequencies satisfy the second equation and do not satisfy the first equation, and a torsional spring constant of the second connection portion around the first axis is smaller than the torsional spring constant of the first connection portion around the first axis.

21. The actuator device according to claim 18, wherein the first connection portion includes a widened portion whose width increases as approaching the first movable portion when seen in a direction perpendicular to a plane on which the support portion, the first movable portion, and the second movable portion are disposed and the first connection portion is connected to the first movable portion at the widened portion.

22. The actuator device according to claim 18, wherein the first connection portion includes a widened portion whose width increases as approaching the second movable portion when seen in a direction perpendicular to a plane on which the support portion, the first movable portion, and the second movable portion are disposed and the first connection portion is connected to the second movable portion at the widened portion.

23. The actuator device according to claim 18, wherein the first connection portion includes a first widened portion whose width increases as approaching the first movable portion and a second widened portion whose width increases as approaching the second movable portion when seen in a direction perpendicular to a plane on which the support portion, the first movable portion, and the second movable portion are disposed and the first connection portion is connected to the first movable portion at the first widened portion and is connected to the second movable portion at the second widened portion.

24. A method for producing an actuator device including a support portion, a first movable portion, a second movable portion that has a frame shape and surrounds the first movable portion, a first connection portion that connects the first movable portion and the second movable portion to each other such that the first movable portion is swingable around a first axis, a second connection portion that connects the second movable portion and the support portion to each other such that the first movable portion is swingable around the first axis by vibrating the second movable portion, and a drive unit that applies a drive force to the second movable portion, wherein the actuator is produced such that two natural angular frequencies $\omega_1$ and $\omega_2$ (where $\omega_1 < \omega_2$) for vibration of the first movable portion and the second movable portion around the first axis satisfy one of the following equation (5) and equation (6) and do not satisfy the other,

[Equation 5]
$$0 < 1 - \left(\frac{\omega_1}{\omega_{ii}}\right)^2 \leq 0.2 \quad (5)$$

[Equation 6]
$$0 < \left(\frac{\omega_2}{\omega_{ii}}\right)^2 - 1 \leq 0.2 \quad (6)$$

where in the above equations, $\omega_{ii} = (k_i/j_i)^{1/2}$, $k_i$ is a torsional spring constant of the first connection portion around the first axis, and $j_i$ is an inertia moment of the first movable portion around the first axis.

25. The method according to claim 24, wherein the two natural angular frequencies satisfy the first equation and do not satisfy the second equation, and a torsional spring constant of the second connection portion around the first axis is larger than the torsional spring constant of the first connection portion around the first axis.

26. The method according to claim 24, wherein the two natural angular frequencies satisfy the second equation and do not satisfy the first equation, and a torsional spring constant of the second connection portion around the first axis is smaller than the torsional spring constant of the first connection portion around the first axis.

27. The method according to claim 24, wherein the first connection portion includes a widened portion whose width increases as approaching the first movable portion when seen in a direction perpendicular to a plane on which the support portion, the first movable portion, and the second movable portion are disposed and the first connection portion is connected to the first movable portion at the widened portion.

28. The method according to claim 24, wherein the first connection portion includes a widened portion whose width increases as approaching the second movable portion when seen in a direction perpendicular to a plane on which the support portion, the first movable portion, and the second movable portion are disposed and the first connection portion is connected to the second movable portion at the widened portion.

29. The method according to claim 24, wherein the first connection portion includes a first widened portion whose width increases as approaching the first movable portion and a second widened portion whose width increases as approaching the second movable portion when seen in a direction perpendicular to a plane on which the support portion, the first movable portion, and the second movable portion are disposed and the first connection portion is connected to the first movable portion at the first widened portion and is connected to the second movable portion at the second widened portion.

30. A method for producing an actuator device including a support portion, a first movable portion, a second movable portion that has a frame shape and surrounds the first movable portion, a first connection portion that connects the first movable portion and the second movable portion to each other such that the first movable portion is swingable around a first axis, a second connection portion that connects the second movable portion and the support portion to each other, and a drive unit that is provided in at least one of the first movable portion and the first connection portion to apply a drive force to the first movable portion, wherein the actuator is produced such that two natural angular frequencies $\omega_1$ and $\omega_2$ (where $\omega_1 < \omega_2$) for vibration of the first movable portion and the second movable portion around the first axis satisfy one of the following equation (7) and equation (8) and do not satisfy the other,

[Equation 7]
$$0 < \frac{4\omega_{io}^2}{\omega_{oo}^2 - \omega_1^2} \leq 1 \tag{7}$$

[Equation 8]
$$\frac{\omega_{oo}^2 - \omega_2^2}{\omega_{io}^2} \leq -6 \tag{8}$$

where in the above equations, $\omega_{io} = (k_i/j_o)^{1/2}$, $\omega_{oo} = (k_o/j_o)^{1/2}$, $k_i$ is a torsional spring constant of the first connection portion around the first axis, $k_o$ is a torsional spring constant of the second connection portion around the first axis, and $j_o$ is an inertia moment of the second movable portion around the first axis.

31. The method according to claim 30, wherein the two natural angular frequencies satisfy the first equation and do not satisfy the second equation, and a torsional spring constant of the second connection portion around the first axis is larger than the torsional spring constant of the first connection portion around the first axis.

32. The method according to claim 30, wherein the two natural angular frequencies satisfy the second equation and do not satisfy the first equation, and a torsional spring constant of the second connection portion around the first axis is smaller than the torsional spring constant of the first connection portion around the first axis.

33. The method according to claim 30, wherein the first connection portion includes a widened portion whose width increases as approaching the first movable portion when seen in a direction perpendicular to a plane on which the support portion, the first movable portion, and the second movable portion are disposed and the first connection portion is connected to the first movable portion at the widened portion.

34. The method according to claim 30, wherein the first connection portion includes a widened portion whose width increases as approaching the second movable portion when seen in a direction perpendicular to a plane on which the support portion, the first movable portion, and the second movable portion are disposed and the first connection portion is connected to the second movable portion at the widened portion.

35. The method according to claim 30, wherein the first connection portion includes a first widened portion whose width increases as approaching the first movable portion and a second widened portion whose width increases as approaching the second movable portion when seen in a direction perpendicular to a plane on which the support portion, the first movable portion, and the second movable portion are disposed and the first connection portion is connected to the first movable portion at the first widened portion and is connected to the second movable portion at the second widened portion.

\* \* \* \* \*